(12) United States Patent
Nose et al.

(10) Patent No.: US 8,635,040 B2
(45) Date of Patent: Jan. 21, 2014

(54) SIGNAL MEASURING DEVICE AND SIGNAL MEASURING METHOD

(75) Inventors: Koichi Nose, Tokyo (JP); Masayuki Mizuno, Tokyo (JP); Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 441 days.

(21) Appl. No.: 12/519,837

(22) PCT Filed: Dec. 19, 2007

(86) PCT No.: PCT/JP2007/074396
§ 371 (c)(1),
(2), (4) Date: Jun. 18, 2009

(87) PCT Pub. No.: WO2008/075702
PCT Pub. Date: Jun. 26, 2008

(65) Prior Publication Data
US 2010/0042373 A1 Feb. 18, 2010

(30) Foreign Application Priority Data

Dec. 21, 2006 (JP) ................. 2006-344648

(51) Int. Cl.
*G01R 13/02* (2006.01)
(52) U.S. Cl.
USPC .............. 702/66; 702/57; 702/89; 702/125; 702/189; 327/100; 327/141; 327/160; 375/355; 375/376; 714/731; 714/744
(58) Field of Classification Search
USPC ............ 702/57, 66, 69, 71, 75, 78, 89, 189, 702/193, 125; 327/100, 141, 160; 375/355, 375/376; 714/713, 744
See application file for complete search history.

(56) References Cited

U.S. PATENT DOCUMENTS

| | | | | |
|---|---|---|---|---|
| 5,689,414 A | * | 11/1997 | Eitrich | 700/7 |
| 5,714,954 A | * | 2/1998 | Chung et al. | 341/147 |
| 7,136,097 B1 | * | 11/2006 | Toyoda et al. | 348/222.1 |
| 7,188,289 B2 | | 3/2007 | Nakamura | |
| 2006/0114468 A1 | * | 6/2006 | Kataoka | 356/450 |
| 2007/0005794 A1 | * | 1/2007 | Graham | 709/231 |
| 2008/0147340 A1 | * | 6/2008 | Gebara et al. | 702/69 |

FOREIGN PATENT DOCUMENTS

| | | |
|---|---|---|
| JP | 1996223254 A | 8/1996 |
| JP | 1998260864 A | 9/1998 |
| JP | H10307166 A | 11/1998 |
| JP | 3711884 B | 8/2005 |
| JP | 2005265698 A | 9/2005 |

OTHER PUBLICATIONS

International Search Report for PCT/JP2007/074396 mailed Feb. 12, 2008.
Japanese Office Action for JP2008-550161 mailed on Oct. 16, 2012.

* cited by examiner

*Primary Examiner* — Alexander H Taningco
*Assistant Examiner* — Paul D Lee

(57) ABSTRACT

A signal measuring device, comprises one set, or a plurality of sets, of measuring unit(s) measuring an object of measurement in synch with a driving clock signal for measurement and outputting result of measurement as first data, and a timing identification unit which, in accordance with a measurement-start command, outputs a value, which differs every period, as second data in synch with a reference signal having a prescribed period and a speed lower than that of the driving clock signal; and a storage unit collecting and successively storing the first data and the second data as one set in synch with the driving clock signal.

18 Claims, 29 Drawing Sheets

FIG.4

| A | MS |
|---|---|
| 0 | a1 |
| 0 | b1 |
|   | .. |
|   | .. |
| 0 | f1 |
| 1 | g1 |
|   | .. |
|   | .. |

FIG.5

| A | MS | OPERATION TIMING |
|---|---|---|
| 0 | a1 | → 0 |
| 0 | b1 | → $T_s * 1/6$ |
|  | .. |  |
|  | .. |  |
| 0 | f1 | → $T_s * 5/6$ |
| 1 | g1 | → $T_s$ |
|  | .. |  |
|  | .. |  |

SIX { (rows 1–6)

FIG.7

| | A | MS | OPERATION TIMING |
|---|---|---|---|
| SIX { | 0 | a1 | → 0 |
| | 0 | b1 | → Ts*1/6 |
| | | .. | |
| | | .. | |
| | 0 | f1 | → Ts*5/6 |
| THREE { | 1 | g1 | → Ts |
| | 1 | l1 | |
| | 1 | k1 | → Ts*(1+2/3) |
| | 2 | m1 | → Ts*2 |
| | | .. | |

FIG.10

| A | MS |
|---|---|
| 1 | g1 |
| 0 | h1 |
|   | .. |
|   | .. |
| 0 | a1 |
|   | .. |
|   | .. |
| 0 | b1 |
|   | .. |
|   | .. |

FIG.13

| A1 | A2 | MS |
|----|----|----|
| 0  | 0  | a1 |
| 0  | 1  | b1 |
| .. | .. | .. |
| .. | .. | .. |
| 0  | 5  | f1 |
| 1  | 0  | g1 |
| .. | .. | .. |
| .. | .. | .. |

FIG.19

| A1 | A2 | A3 | MS |
|---|---|---|---|
| 0 | 0 | 5 | a1 |
| 0 | 1 | 5 | b1 |
| .. | .. | .. | .. |
| .. | .. | .. | .. |
| 0 | 5 | 5 | f1 |
| 1 | 0 | 5 | g1 |
| 1 | 1 | 5 | h1 |
| .. | .. | .. | .. |

|  | A1b | A2b | MSb |
|---|---|---|---|
| FOUR { | 0 | 0 | a2 |
| | 0 | 1 | b2 |
| | 0 | 2 | c2 |
| | 0 | 3 | d2 |
| | 1 | 0 | e2 |
| | .. | .. | .. |
| | .. | .. | .. |

SIGNAL MEASURING DEVICE AND SIGNAL MEASURING METHOD

This application is the National Phase of PCT/JP2007/074396 filed Dec. 19, 2007, which claims the benefit of previous Japanese Patent Application No. 2006-344648 (filed on Dec. 21, 2006), which is hereby incorporated by reference herein in its entirety.

TECHNICAL FIELD

The present invention relates to a signal measuring device and signal measuring method. More particularly, the invention relates to a technique for identifying the output timing of a measurement-result signal in a semiconductor integrated circuit device.

BACKGROUND ART

Power supply noise generated within a semiconductor integrated circuit device (LSI) is increased by microfabrication within the LSI chip and by higher speed. Furthermore, with advances that have been made in lowering voltage, there has been a remarkable increase in cases in which noise, clock fluctuation (jitter) and temperature variations, etc., give rise to chip malfunction. Further, owing to the higher integration that accompanies microfabrication, behavior within the chip is becoming increasingly complex and it has become difficult to readily estimate malfunction. Accordingly, direct observation of behavior such as noise, jitter and temperature variations within LSI chips in order to specify the cause of malfunction is important.

The general practice conventionally is to sample the power supply and signals externally of the integrated circuit and observe the behavior of the power supply and signals. As the operating frequency of the integrated circuit rises, noise and jitter, etc., having high-frequency components increase. As a consequence, it is difficult to observe noise and jitter within an integrated circuit accurately outside the integrated circuit. Further, in cases where a signal or clock is sampled externally of an integrated circuit, noise and jitter produced in the course of extracting the signal or clock to the exterior of the integrated circuit occur in addition to the noise and jitter produced within the integrated circuit. This makes it difficult to estimate noise and jitter accurately at the point of measurement.

Accordingly, a measuring device is incorporated within a chip, phenomena within the chip are observed by the on-chip phenomena measuring device and the device converts the result of measurement to a digital signal that is readily extracted to the outside of the chip. Such an on-chip phenomena measuring device is effective. The flow of extracting the result of measurement to the chip exterior, applying a conversion to the data extracted externally of the chip and visualizing the behavior of the phenomena is digitized by the on-chip phenomena measuring device. The problem of signal degradation along the signal path can be solved by such processing.

If result of measurement is retained in such a device, there is the danger that the amount of storage will be very great. Accordingly, a trace-data sampling method of lengthening the trace time of the status of registers within an LSI chip without greatly enlarging the scale of the hardware has been disclosed in, e.g., Patent Document 1 as a technique for reducing amount of storage. This method groups a number of registers of the LSI chip or device into a plurality of register groups, selects an event flag in each group and records the values of a register group together with the recording interval only when any one of the event flags is ON. Accordingly, only valid data and the timing of the occurrence thereof are recorded, thereby making possible tracing over a length of time longer than in the conventional case.

Further, Patent Document 2 describes a compressive storage device which, in a case where a successively occurring event is subjected to data compression and then stored, is capable of subsequently specifying a change in stored events and time at which the change occurred. This device stores a time stamp, which specifies the time at which an event change occurred, in a storage unit only when a successively occurring event changes from a reference event or only when a change from a reference event changes. Accordingly, storage capacity necessary for the storage unit can be greatly reduced and it is possible to simply specify the time of occurrence of any measurement data stored in the storage unit.

A trace device capable of simultaneously recording, editing and outputting elapsed-time information when a program is executed is described in Patent Document 3 as related art. This device is such that whenever each instruction phase of a program run by a microprocessor is executed, information about the time at which each instruction was executed and a history of trace-result information are recorded and can be output in correlated form. This makes it possible to perform program debugging efficiently.

[Patent Document 1]
Japanese Patent No. 3711884
[Patent Document 2]
Japanese Patent Kokai Publication No. JP-A-8-223254
[Patent Document 3]
Japanese Patent Kokai Publication No. JP-A-10-260864

SUMMARY

It should be noted that the content disclosed in Patent Documents 1 to 3 cited above is hereby incorporated by reference herein in its entirety. The present invention offers an analysis of the related art, as set forth below.

Since an identification signal for a measured result fluctuates in synch with the driving clock of the measuring device, an identification signal generating circuit that operates stably at high speed is required as driving clock speeds rise. Further, in a case where there is need for counter values in a number equivalent to the number of measurement cycles, the number of bits necessary for the identification signal increases and circuit timing design becomes more difficult. In particular, in cases where the driving clock signal takes on a near-gigahertz frequency, jitter and frequency fluctuation increase and it becomes difficult to estimate measurement time with satisfactory precision.

It is an object of the present invention to provide a signal measuring device and signal measuring method that make it possible to estimate measurement time with satisfactory precision at low-speed operation.

A signal measuring device according to one aspect of the present invention comprises: one set, or a plurality of sets, of measuring unit(s) measuring an object of measurement in synch with a driving clock signal for measurement and outputting result of measurement as first data, and a timing identification unit which, in accordance with a measurement-start command, outputs a value, which differs every period, as second data in synch with a reference signal having a prescribed period and a speed lower than that of the driving clock signal; and a storage unit collecting and successively storing the first data and the second data as one set in synch with the driving clock signal.

In the signal measuring device of the present invention, the timing identification unit may be adapted to have a reset-equipped counter, which is reset in accordance with the measurement-start command, for outputting the second data upon its value being incremented or decremented by one every period of the reference signal.

In the signal measuring device of the present invention, it is preferred that the reference signal have a period that is a whole-number multiple of the driving clock signal.

In the signal measuring device of the present invention, the timing identification unit may be adapted to have a first reset-equipped counter, which is reset in accordance with the measurement-start command, for outputting one constituent element of the second data upon its value being incremented or decremented by one every period of the reference signal; and a second reset-equipped counter, which is reset when the measurement-start command is input or when one edge of the reference signal is input, for outputting another constituent element in the second data upon its value being incremented or decremented by one every period of the reference signal.

In the signal measuring device, the second reset-equipped counter may be adapted to receive as an input a measurement frequency information signal indicating what multiple the period of the driving clock signal is in comparison with the period when it is shortest, and to changeover the counting increment based upon the measurement frequency information signal instead of being incremented or decremented by one.

In the signal measuring device of the present invention, the timing identification unit may be adapted to have a register that holds an output of the second reset-equipped counter that prevails immediately before one edge of the reference clock signal is input; wherein the second data includes the output data of the register as a further constituent element.

The signal measuring device may further comprise a comparator and an output controller provided with respect to at least one set of the one or plurality of sets of the measuring unit and timing identification unit; wherein the comparator determines whether the first data falls within a prescribed range, and the output controller exercises control in such a manner that if the first data does not fall within the prescribed range, then the first data that does not fall within the prescribed range and second data corresponding to the first data that does not fall within the prescribed range are stored in the storage unit successively as one set.

In the signal measuring device of the present invention, reference signals in respective ones of the plurality of sets may be a common reference signal.

In the signal measuring device of the present invention, it is preferred that the reference signal adopted as the common reference signal have a period that is a whole-number multiple of the lowest common multiple of the periods of the driving clock signals in respective ones of the plurality of sets.

The signal measuring device of the present invention may further comprise: a digital-to-analog converter reading out the first data successively in order of decreasing age in terms of storage in the storage unit, and converting the first data to an analog value; and a timing generator operating the digital-to-analog converter at a prescribed period.

In the signal measuring device of the present invention, it may be so arranged that the prescribed period varies in conformity with the second data read out of the storage unit together with the first data.

The signal measuring device of the present invention may be included in a semiconductor integrated circuit device.

According to another aspect of the present invention, a signal measuring method comprises: measuring an object of measurement in synch with a driving clock signal for measurement and outputting result of measurement as first data; in accordance with a measurement-start command, outputting a value, which differs every period, as second data in synch with a reference signal having a prescribed period at a speed lower than that of the driving clock signal; and collecting and successively storing the first data and the second data as one set of data in synch with the driving clock signal.

At the outputting the value as the second data in the signal measuring method of the present invention, it may be so arranged that reset is performed in accordance with the measurement-start command and the second data is output upon its value being incremented or decremented by one every period of the reference signal.

In the signal measuring method of the present invention, it is preferred that the reference signal have a period that is a whole-number multiple of the driving clock signal.

In the signal measuring method of the present invention, the outputting the value as the second data may include: a first step, which is reset in accordance with the measurement-start command, wherein one constituent element of the second data is output upon its value being incremented or decremented by one every period of the reference signal; and a second step, which is reset when the measurement-start command is input or when one edge of the reference signal is input, wherein another constituent element of the second data is output upon its value being incremented or decremented by one every period of the reference signal.

At the second step in the signal measuring method of the present invention, it may be so arranged that a measurement frequency information signal indicating what multiple the period of the driving clock signal is in comparison with the period when it is shortest is received as an input, and the counting increment is changed over based upon the measurement frequency information signal instead of being incremented or decremented by one.

In the signal measuring method of the present invention, the second step may include holding another element of the second data that prevails immediately before one edge of the reference clock signal is input; wherein the second data includes this held other constituent element as a further constituent element.

In the signal measuring method of the present invention, the successively storing the first data and the second data may include: determining whether the first data falls within a prescribed range; and if the first data does not fall within the prescribed range, storing successively, as one set, the first data that does not fall within the prescribed range and second data corresponding to the first data that does not Pill within the prescribed range.

The signal measuring method of the present invention may further comprise: reading out the first data successively in order of decreasing age in terms of storage; and converting the read-out first data to an analog value and outputting the analog value.

At the converting the first data to an analog value and outputting the analog value in the signal measuring method of the present invention, it may be so arranged that the period in which the conversion is made to the analog value varies in conformity with the second data read out together with the first data.

In accordance with the present invention, measurement timing is identified using a reference signal having a speed lower than that of a driving clock signal for measurement. As a result, it possible to estimate measurement time with satisfactory precision using a reference signal having an operating frequency that is low in comparison with the prior art.

BRIEF DESCRIPTION OF THE DRAWINGS

FIG. 4 is a diagram illustrating the structure of data that has been stored in a storage unit according to a first exemplary embodiment of the present invention;

FIG. 5 is a diagram useful in describing a method of identifying timing at which measurement-result signals are generated;

FIG. 7 is a diagram illustrating another structure of data that has been stored in a storage unit according to a first exemplary embodiment of the present invention;

FIG. 10 is a diagram illustrating structure of data that has been stored with regard to a case where the data is stored at storage unit addresses different from the order in which the data is generated;

FIG. 13 is a diagram illustrating the structure of data that has been stored in a storage unit according to a second exemplary embodiment of the present invention;

FIG. 19 is a diagram illustrating the structure of data that has been stored in a storage unit according to a third exemplary embodiment of the present invention;

FIG. 23 is a second diagram illustrating the structure of data that has been stored in a storage unit according to a fourth exemplary embodiment of the present invention;

PREFERRED MODES

Figure 1:
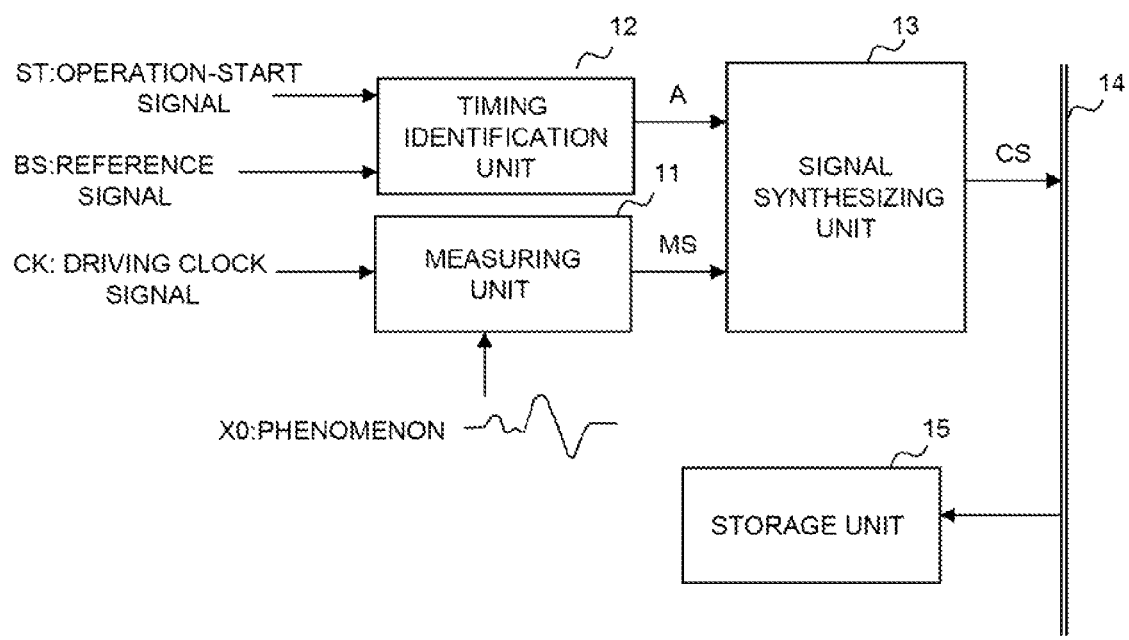
FIG. 1 is a block diagram illustrating the configuration of a signal measuring device according to a first exemplary embodiment of the present invention.

A signal measuring device according to exemplary embodiments of the present Invention is a semiconductor integrated circuit device for measuring a phenomenon (which corresponds to X0 in FIG. 1) in synch with a first clock (which corresponds to CK in FIG. 1) and outputting result of the measurement, and includes a measuring unit (which corresponds to 11 in FIG. 1) for outputting the result; a measurement-start signal (which corresponds to ST in FIG. 1) for communicating start of measurement; a reference clock (which corresponds to BS in FIG. 1) having a fixed period different from that of a first clock; an identification unit (which corresponds to 12 in FIG. 1) for outputting a value that differs for every rising edge of the reference clock; and an encoder (which corresponds to 13 in FIG. 1) for outputting a synthesized signal obtained by combining result of measurement and a counter value.

The identification unit may be constituted by a reset-equipped counter, in which the value whereof is reset to 0 when the measurement signal rises and is incremented by one at every rising edge of the reference clock.

The reference clock may have a period that is a whole-number multiple of the first clock.

Further, the identification unit may be constituted by a first reset-equipped counter, in which a higher order bit of an identification signal is reset to 0 when the operation-start signal is input, for being incremented by one whenever the reference signal rises; and a second reset-equipped counter, in which a lower order bit of the identification signal is incremented by one whenever a measuring-device driving clock rises and is reset to 0 when the operation-start signal is input thereto or when the reference signal rises.

Furthermore, it may be so arranged that a first identification unit (which corresponds to 12a in FIG. 20) is made to correspond to a first measuring unit (11a in FIG. 20) for outputting result of measurement in synch with a first clock (which corresponds to CKa in FIG. 20), a second identification unit (which corresponds to 12b in FIG. 20) is made to correspond to a second measuring unit (which corresponds to 11b in FIG. 20) for outputting result of measurement in synch with a second clock (which corresponds to CKb in FIG. 20), a common reference signal (which corresponds to BS in FIG. 20) is applied to the first identification unit and second identification unit, and the identification signal fluctuates at a common frequency.

Further, the reference clock may have a period that is a whole-number multiple of the lowest common multiple of the period of the first clock and the period of the second clock.

Furthermore, the identification unit may be constituted by a first reset-equipped counter, in which a higher order bit of an identification signal is reset to 0 when the operation-start signal is input thereto, for being incremented by one whenever the reference signal rises; a second reset-equipped counter, in which a lower order bit of the identification signal is incremented by one whenever a measuring-unit driving clock rises and is reset to 0 when the operation-start signal is input thereto or when the reference signal rises; and a register for storing value of a lower order bit of the identification signal whenever the reference signal rises.

There may be provided a memory (which corresponds to 15a in FIG. 28) for storing the order in which the synthesized signals are output; a digital-to-analog converting circuit (which corresponds to 32 in FIG. 28) for converting, to an analog value, a measurement-result signal described in the oldest synthesized signal within the memory; and a timing generating circuit (which corresponds to 31 in FIG. 28) for operating the digital-to-analog converting circuit at a fixed period.

In accordance with the signal measuring device as set forth above, an identification signal for identifying measurement timing is generated solely from a low-speed reference signal, the identification signal is appended to a measurement-result signal and the time at which each measurement-result signal was generated is estimated. In comparison with the conventional counter control method, therefore, the distribution problem is mitigated and it is possible to estimate measurement time with satisfactory precision using a measurement-start signal having a low operating frequency and a reference signal. The present invention will now be described in detail in accordance with exemplary embodiments thereof with reference to the drawings.

First Exemplary Embodiment (Method of storing all measurement data in memory in order)

FIG. 1 is a block diagram illustrating the configuration of a signal measuring device according to a first exemplary embodiment of the present invention. The signal measuring device in FIG. 1 includes a measuring unit 11, a timing identification unit 12, a signal synthesizing unit 13, a data bus 14 and a storage unit 15. The measuring unit 11 measures a phenomenon X0 in synch with a driving clock signal CK that is for measuring purposes and outputs a measurement result every period of the driving clock signal CK as a measurement-result signal MS. Meanwhile, the timing identification unit 12, which identifies the timing at which the measuring unit 11 operates, receives as inputs an operation-start signal ST, which is used as timing for starting the output of measurement data, and a reference signal BS that rises at a fixed period, and outputs an identification signal A. The signal synthesizing unit 13 generates a synthesized signal CS by combining the measurement-result signal MS and the identification signal A. Synthesized signals CS are stored in the storage unit 15 successively via the data bus 14 by a control function, etc., not shown. All periods of the measurement-result signal MS are stored in the storage unit 15 at this time. When the data stored, it is so arranged that the data is written to memory in order starting from the leading bit in such a manner that the order in which the measurement-result signals were generated will be identified in a case where the stored data is read out.

Figure 2:
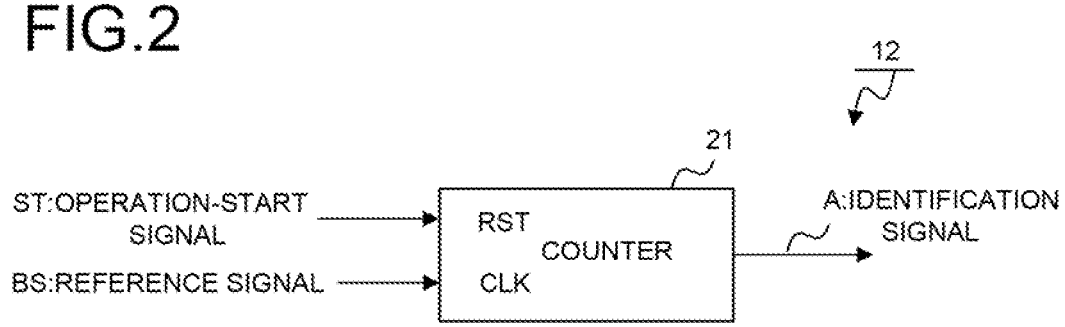
FIG. 2 is a block diagram illustrating the configuration of a timing identification unit according to a first exemplary embodiment of the present invention.

FIG. 2 is a block diagram illustrating the configuration of the timing identification unit 12. The timing identification unit 12 is constituted by a reset-equipped counter 21. The counter 21 is such that the value of the identification signal A is incremented by one at every rising edge (or at every falling edge) of the reference signal BS and is reset to 0 when an operation-start signal ST is input to the counter. It is assumed that the period of the driving clock signal CK is fixed.

Figure 3:
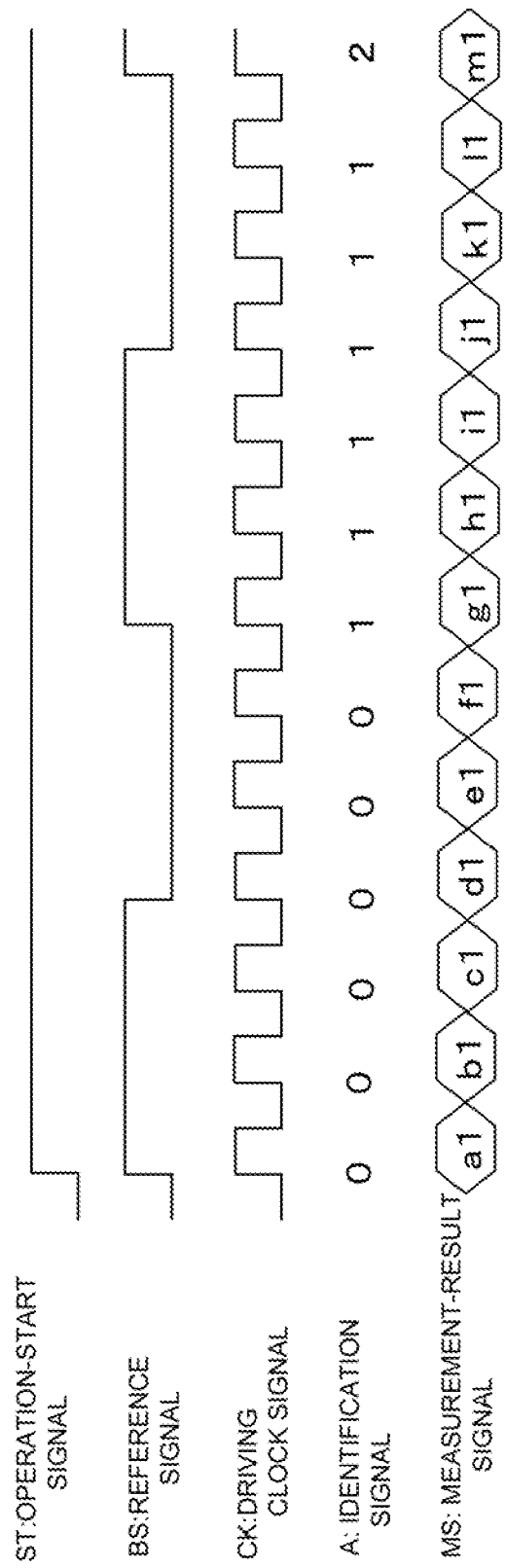
FIG. 3 is a diagram illustrating the operation timings of a signal measuring device according to a first exemplary embodiment of the present invention.

FIG. 3 is a diagram illustrating the operation timings of the signal measuring device according to the first exemplary embodiment of the present invention. When the operation-start signal ST rises, the value of the identification signal A is reset to 0. The values of the identification signal A and the values of the measurement-result signal MS are combined, with the values of the measurement-result signal MS being a1, b1, c1, . . . measured by the measuring unit 11 after the operation-start signal ST rises. The result is stored in the storage unit 15. The value of the identification signal A is incremented to 1 at the next rising edge of the reference signal. BS. The value 1 of the identification signal A is combined with values g1, h1, . . . of the measurement-result signal MS from this moment onward.

Figure 4:
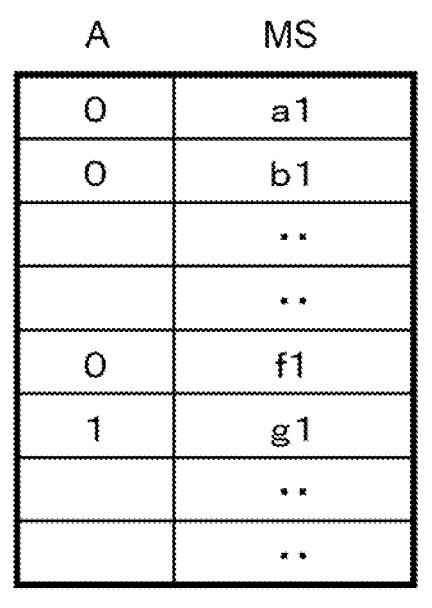

FIG. 4 is a diagram illustrating the structure of data that has been stored in the storage unit 15. As illustrated in FIG. 4, measurement results obtained when the identification signal A was 1 are stored successively to follow measurement results obtained when the identification signal A was 0. Furthermore, the identification signal A is incremented to 2, 3, . . . and so on whenever the reference signal BS rises. The synthesized signals CS are thus stored in memory successively in such a manner that the order in which results were generated can be specified afterward.

Next, a method of extracting the data that has thus been stored in the storage unit 15 and identifying the generation timing of the measurement-result signals is illustrated in FIG. 5. First, among those synthesized signals that have been stored, the number thereof for which the values of the identification signal A are identical is counted. It is estimated that data was measured at equal time intervals (Ts/(number of items of data)) within the period (let Ts represent the period) of the reference signal a number of times equivalent to this number of synthesized signals counted. For example, since the number of items of data for which the identification signal A is 0 is six, as illustrated in FIG. 3, it is estimated that each item of data was generated every Ts/6. In a case where the period Ts of the reference signal BS is a whole-number multiple of the period of the driving clock signal CK and, moreover, the period of the driving clock signal. CK is fixed, the operation timings estimated by the above-described method will be identical with the timing of the driving clock signal CK in FIG. 3.

Figure 6:
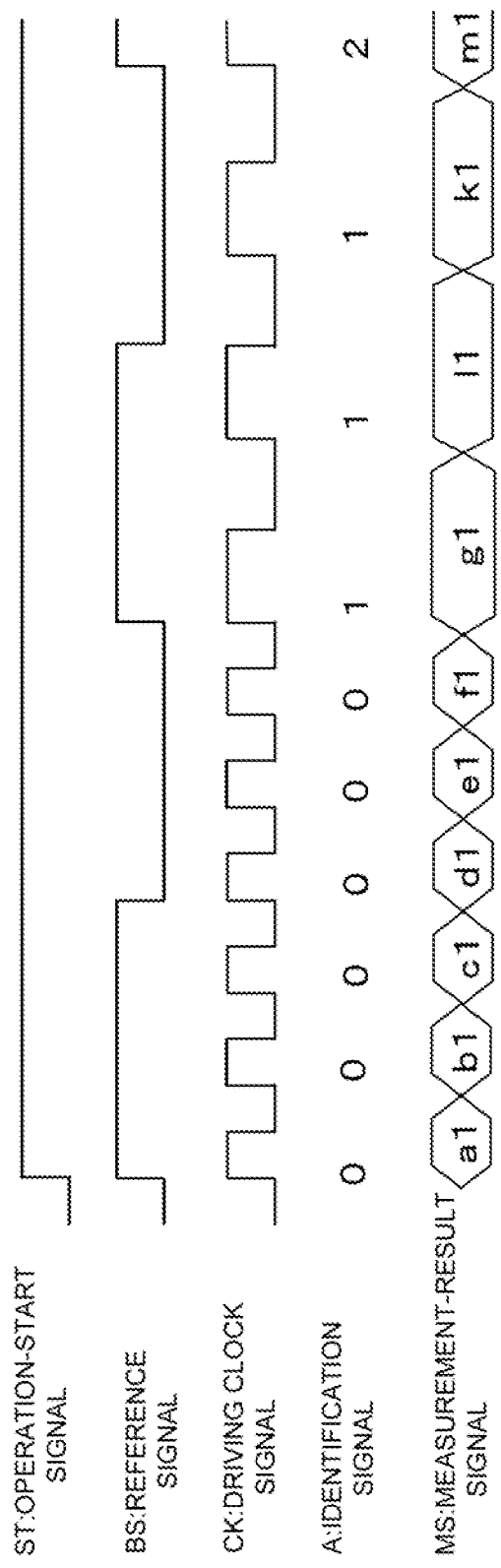
FIG. 6 is a diagram illustrating other operation timings of a signal measuring device according to a first exemplary embodiment of the present invention.

FIG. 6 is a diagram illustrating other operation timings of a signal measuring device according to the first exemplary embodiment of the present invention. In a case where the period of the driving clock signal CK is caused to change, as illustrated in FIG. 6, measurement precision changes depending upon whether or not the following conditions (1) and (2) are satisfied:

(1) The occurrence of the change in the period of the driving clock signal CK is limited solely to the timing of the rising edge of the reference signal BS.

(2) The period Ts of the reference signal BS is decided in such a manner that the period Ts of the reference signal is always a whole-number multiple of the shortest period of the driving clock signal CK.

In a case where (1) and (2) mentioned above are satisfied, synthesized signals CS for which the values of the identification signal A are identical will be generated at intervals that are always equal time intervals (Ts/(number of items of data)). For example, the structure of the data stored in conformity with the time chart shown in FIG. 6 is as illustrated in FIG. 7. It is estimated in FIG. 7 that the items of data were generated every Ts/6 with respect to values a1, b1, ... f1 of the measurement-result signal MS. Further, it is estimated that the items of data were generated every Ts/3 with respect to values g1, I1, k1 of the measurement-result signal MS. Accordingly, the operation timing estimated by the above-described method is identical with the timing of the driving clock signal CK in FIG. 6, as illustrated in FIG. 7.

Even in a case where (1) and (2) mentioned above are not satisfied, on the other hand, or in other words, even in the case of an asynchronous relationship in which the period Ts of the reference signal BS is not a whole-number multiple of the period of the driving clock, signal CK, the timing identification unit 12 identical with that shown in FIG. 2 can be applied. In this case, however, an error develops in the estimation of the occurrence timing of the measurement-result signal MS. The number of measurement-signal results for which the values of the identification signal A are identical becomes the value of an integer that is less than either ±1 of the value of the ratio of the period of the reference signal BS to the period of the driving clock signal CK. If this result is compared with the timing of the actual measurement-result signal MS, the generation timings will not be in perfect agreement. However, the timing error can be made to be less than one period of the driving clock signal CK.

Figure 8:
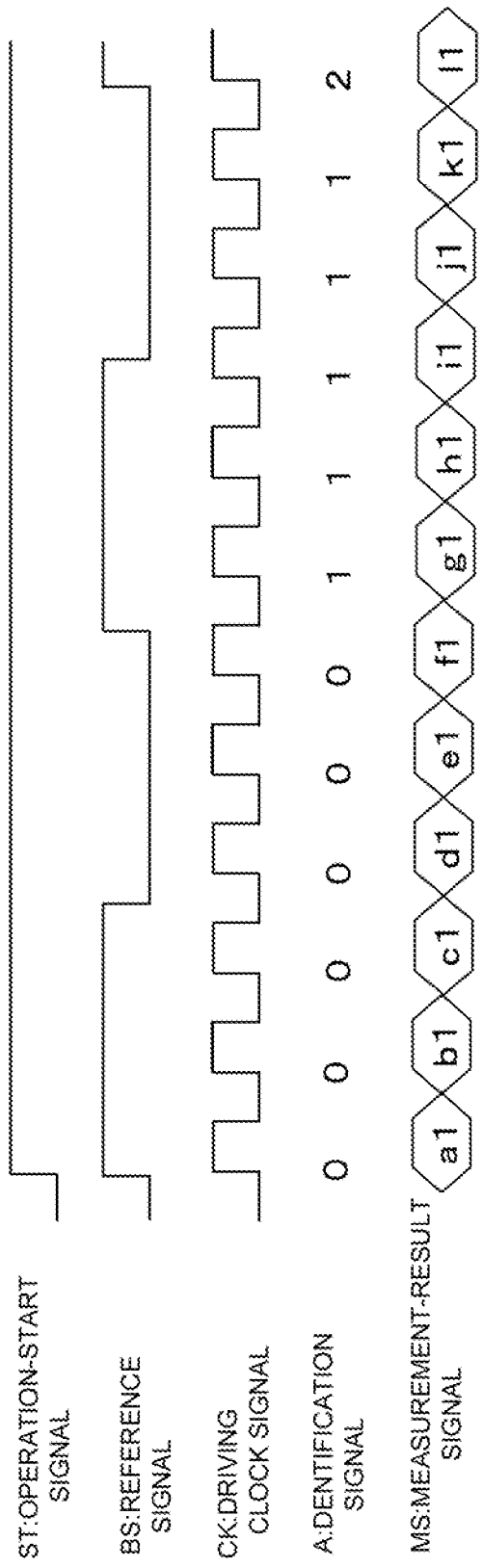
FIG. 8 is a diagram illustrating further operation timings of a signal measuring device according to a first exemplary embodiment of the present invention.
Figure 9:
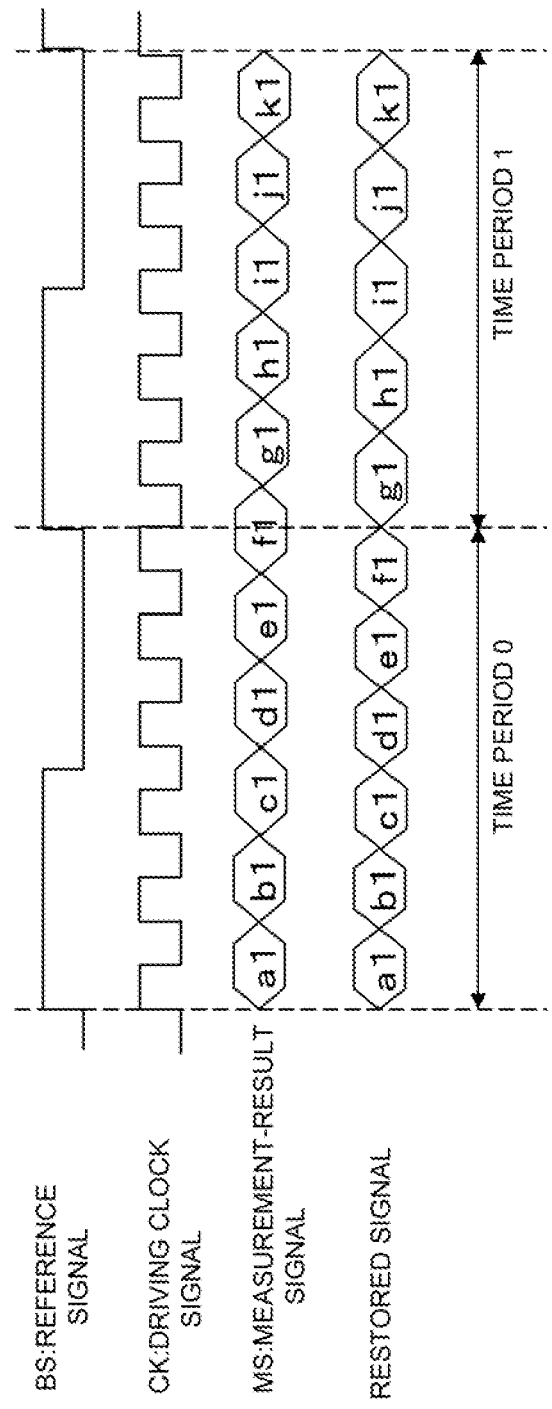
FIG. 9 is a diagram useful in describing further operation timings of a signal measuring device according to a first exemplary embodiment of the present invention.

This will be described with regard to a specific example. FIG. 8 is a diagram illustrating further operation timings of the signal measuring device according to the first exemplary embodiment of the present invention. Here a case where the period of the reference signal BS is 5.5 times the period of the driving clock signal CK, as shown in FIG. 8, is taken as an example. The number of measurement-signal results for which the values of the identification signal A are 0 is six, the number of measurement-signal results for which the values of the identification signal A are 1 is five and the number of measurement-signal results for which the values of the identification signal A are 2 is six. Thus, the numbers five and six repeat. In a case where the synthesized signal that has been stored in the storage unit 15 is extracted and the timings at which the measurement-result signals MS were generated are estimated by a method similar to that of FIG. 5, if time period 0 is decided upon as the period of the reference signal BS, as shown in FIG. 9, then it is estimated that measurement-result signals a1 to f1 for which the values of the identification signal A are 0 were generated at equal time intervals within the time period 0. Further, if time period 1 is decided upon as the period of the reference signal BS, then it is estimated that measurement-result signals g1 to k1 for which the values of the identification signal A are 1 were generated at equal time intervals within the time period 1. If this result is compared with the timing of the actual measurement-result signal, the generation timings will not be in perfect agreement. However, the timing error can be made to be less than one period of the driving clock signal CK.

Second Exemplary Embodiment

Method of Storing Random Data of Measurement Data

Figure 10:
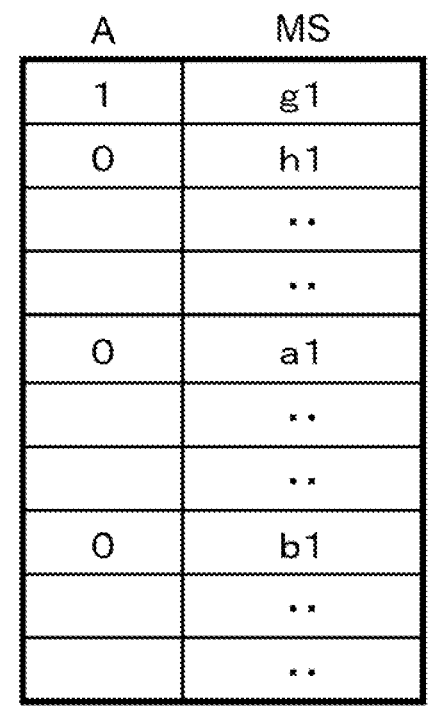

The configuration of the signal measuring device according to the second exemplary embodiment of the present invention is similar to that shown in FIG. 1. However, the internal configuration of the timing identification unit 12 is different. The signal measuring device according to the second exemplary embodiment is illustrated with regard to a case where the measurement-result signals MS of all periods are stored in the storage unit 15 in FIG. 1 but no limitation is applied with respect to the order in which the data is written to the storage unit 15, i.e., the data is stored at addresses in the storage unit 15 in an order different from the order of generation, as illustrated in FIG. 10. When the stored synthesized signals are read out in this case, the data generation timing cannot be identified in order from the leading bit by the method shown in FIG. 5 if the order in which the measurement-result signals MS were generated cannot be identified.

Figure 11:
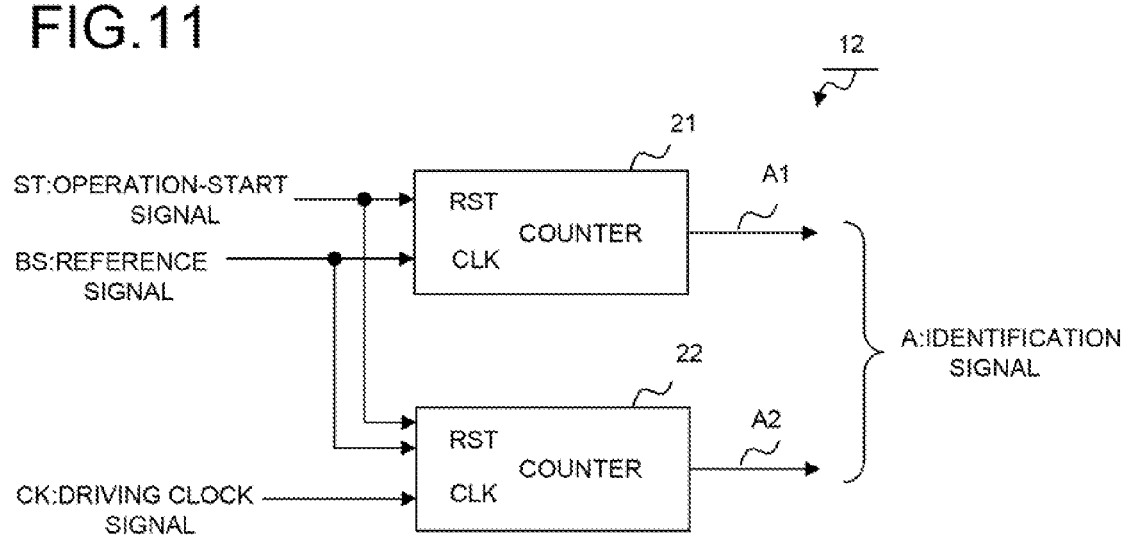
FIG. 11 is a block diagram illustrating the configuration of a timing identification unit according to a second exemplary embodiment of the present invention.

Accordingly, it is so arranged that a signal that enables the data generation order to be identified is appended to the identification signal A. The configuration of the timing identification unit 12 according to the second exemplary embodiment is illustrated in FIG. 11. The timing identification unit 12 is constituted by a reset-equipped counter 21 for generating a higher order bit (A1) of the identification signal A and a reset-equipped counter 22 for generating a lower order bit (A2) of the identification signal A. The reset-equipped counter 21 resets the higher order bit (A1) of the identification signal to 0 when the operation-start signal ST is input thereto. The counter increments the higher order bit (A1) of the identification signal by one whenever the reference signal BS rises following reset. The reset-equipped counter 22 increments the lower order bit (A2) of the identification signal by one whenever the driving clock signal CK rises, and resets the lower order bit (A2) of the identification signal to 0 when the operation-start signal ST is input thereto or when the reference signal BS rises.

Figure 12:
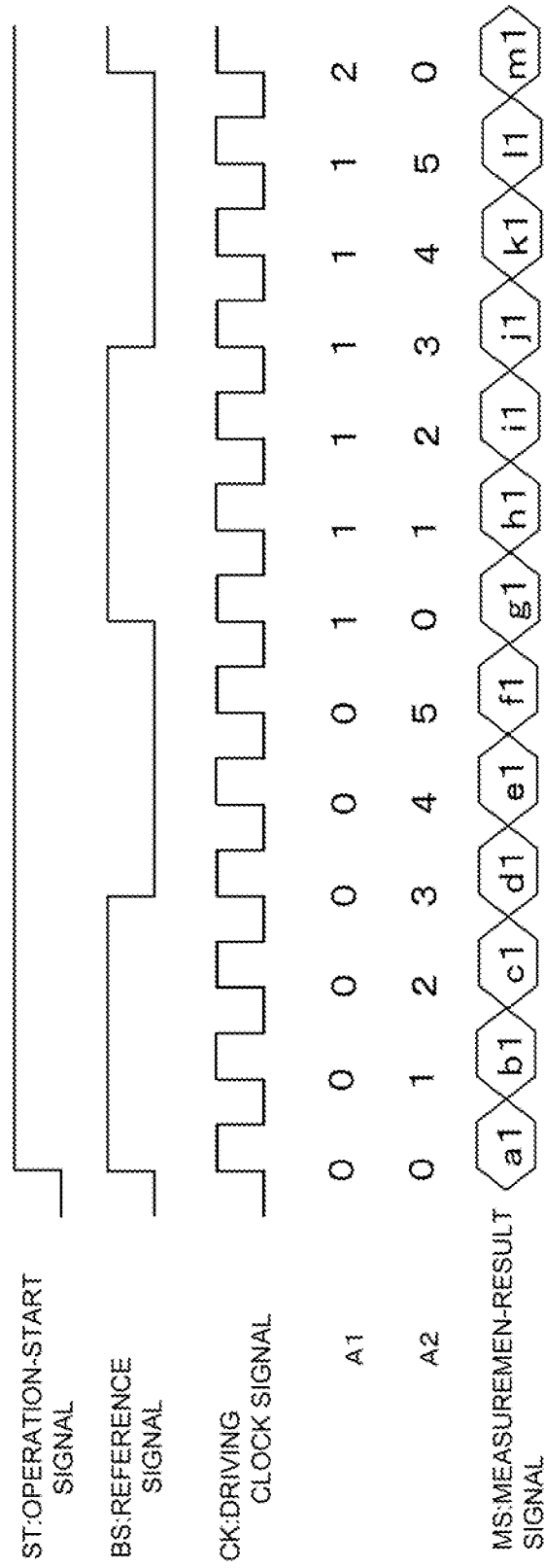
FIG. 12 is a diagram illustrating the operation timings of a signal measuring device according to a second exemplary embodiment of the present invention.
Figure 13:
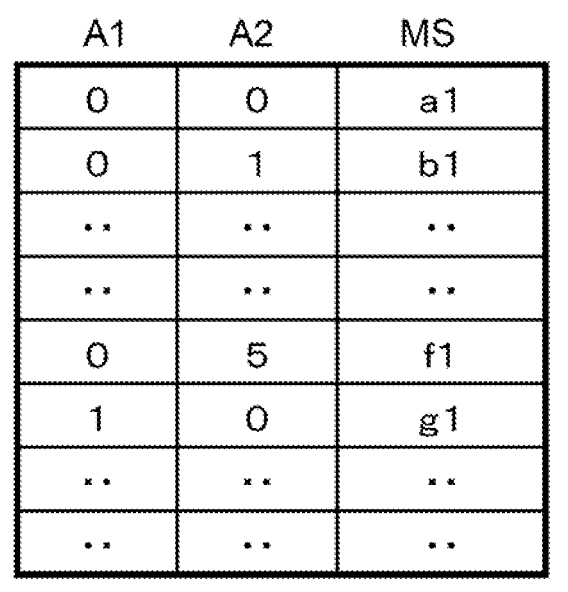

FIG. 12 is a diagram illustrating the operation timings of the signal measuring device according to the second exemplary embodiment of the present invention. When the operation-start signal ST is input, the value of the identification signal A is reset to 0. Whenever the driving clock signal CK rises following reset, the value of the measurement-result signal MS changes in the manner a1, b1, ... and the lower order bit (A2) of the identification signal A in incremented by one. The identification signal A and the measurement-result signal MS are combined by the signal synthesizing unit 13. The higher order bit (A1) of the identification signal A is incremented to 1 and the lower order bit (A2) is reset to 0 at the next rising edge of the reference signal BS. The identification signal A combined with the values g1, h1, ... of the measurement-result signal MS from this point onward is 1 for the higher order bit (A1) and is 0, 1, 2, ... for the lower order bit (A2), the latter being incremented by one whenever the measurement-result signal MS is output. With this method, data is stored in the storage unit 15 irrespective of the order in which the data is generated, as illustrated in FIG. 13. A method of extracting the data from the memory in which it has been stored and identifying the generation timing of the measurement-result signals will be described below.

First, all of the identification signals A for which the higher order bit A1 is 0 are found and the number N0 of these 0's is determined. Then, the generation times of the measurement-result signals for which the higher order bit is 0 are obtained according to Ts*(value (A2) of lower order bit)/N0. Next, all of the identification signals A for which the higher order bit A1 is 1 are found and the number N1 of these 1's is determined. Then, the generation times of the measurement-result signals for which the higher order bit is 1 are obtained according to Ts*(1+(value of lower order bit)/N1. In general, when the value of the higher order bit A1 is M, the value of the lower order bit A2 is T and the number of measurement-result signals MS for which the higher order bit A1 is M is S, the generation timing of the measurement-result signal MS is expressed by Ts*(M±(T/S)). As a result, the generation timings of all of the measurement-result signals MS can be identified.

Figure 14:
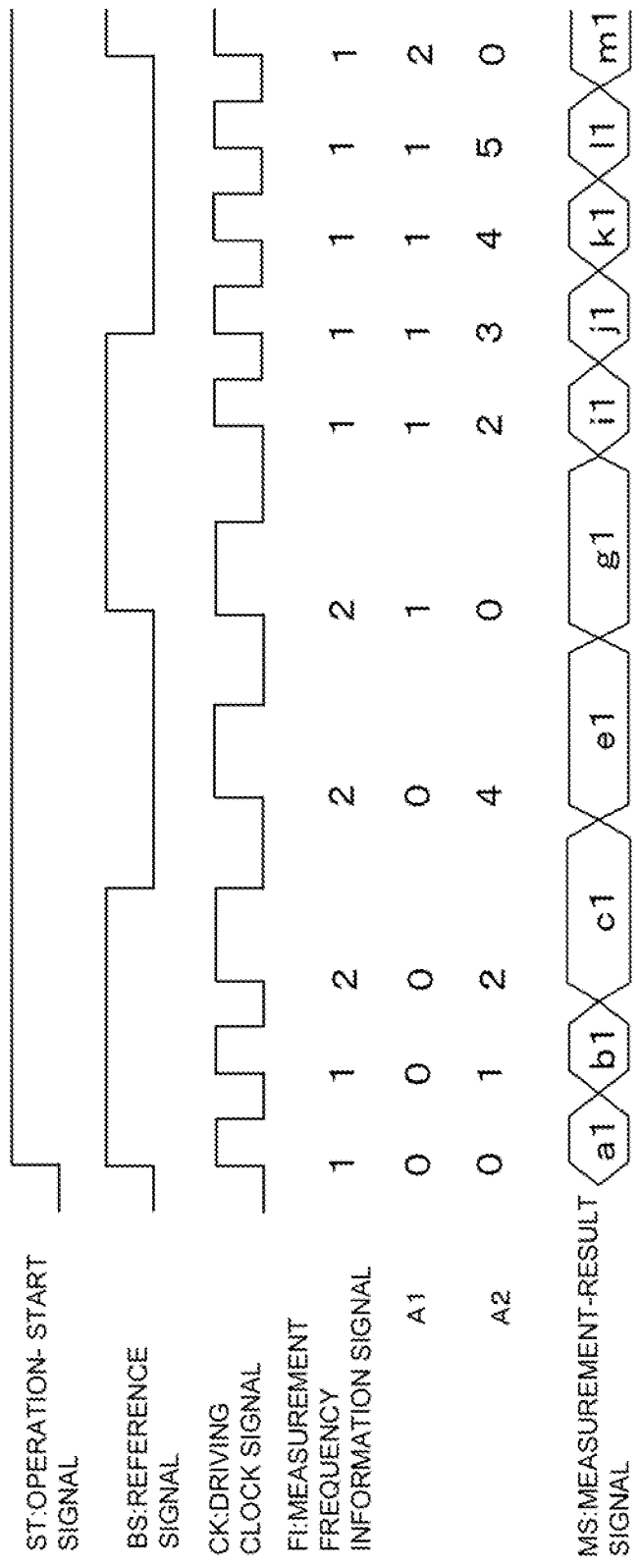
FIG. 14 is a diagram illustrating other operations timing of a signal measuring device according to a second exemplary embodiment of the present invention.
Figure 15:
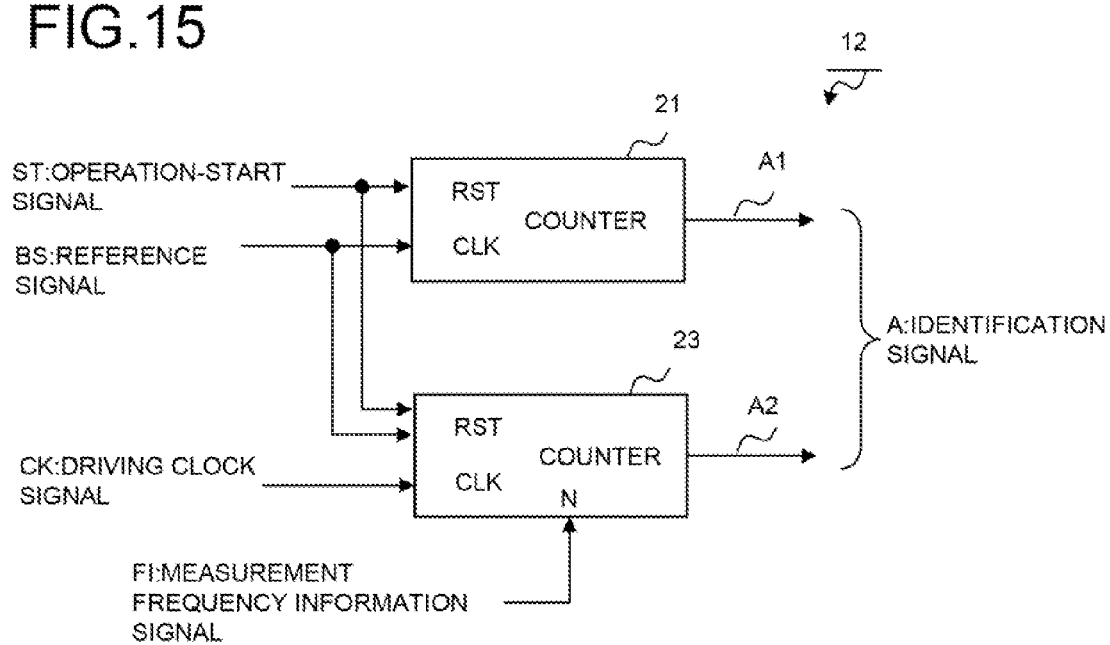
FIG. 15 is a block diagram illustrating another configuration of a timing identification unit according to a second exemplary embodiment of the present invention.

It is assumed in the method of FIG. 6 that the period of the driving clock signal CK is an equal interval within the period of the reference signal BS. Accordingly, if the period of the driving clock signal CK changes at a point within the period of reference signal BS, it so happens that timing is restored as a timing different from the actual time of generation of the measurement results according to the restoration method shown in FIG. 7. In order to deal with this problem, a method of appending a measurement frequency information signal FI, which constantly gives notification of the operating frequency of the driving clock signal CK, will be illustrated. As illustrated in FIG. 14, the measurement frequency information signal FI always indicates what multiple the period of the driving clock signal CK is in comparison with the period when it is shortest. An example of the configuration of the timing identification unit 12 in this case is shown in FIG. 15. This differs from the timing identification unit 12 of FIG. 11 in that the amount of incrementing of a reset-equipped counter 23 for generating the lower order bit (A2) of the identification signal can be changed over by the measurement frequency information signal FI.

Operation in this case is illustrated in the timing chart shown in FIG. 14. First, the identification signal A is reset to 0 when the operation-start signal ST is input. If the driving clock signal CK operates at the shortest period following reset, the values a1, b1, . . . of the measurement-result signal MS are output whenever the driving clock signal CK rises, and the lower order bit (A2) of the identification signal is incremented by one in accordance the value of the measurement frequency information signal FI. In the example depicted in FIG. 14, the period of the driving clock signal CK is shortest over the first two periods. Consequently, 1 is output as the measurement frequency information signal FI and the increment every period of the lower order bit (A2) is one. When the period of the driving clock signal CK subsequently becomes twice the shortest period, 2 is output as the measurement frequency information signal FI and the increment every period of the lower order bit (A2) is two. At the next rising edge of the reference signal BS, the higher order bit (A1) of the identification signal is incremented to 1 and the lower order bit (A2) is reset to 0. Thereafter, the values g1, i1, . . . of the measurement-result signal MS are output and the lower order bit (A2) of the identification signal is incremented according to the value of the measurement frequency information signal FI at every rising edge of the driving clock signal CK.

In accordance with the method set forth above, if the ratio of the period Ts of the reference signal BS to the shortest period of the driving clock signal CK is already known, then the timing of generation of the measurement-result signal MS can be specified from the identification signal A. For example, since the ratio of the period Ts of the reference signal BS to the shortest period of the driving clock signal CK is six in FIG. 14, the timing of generation of the identification signal can be estimated to be T*((higher order bit (A1) of the identification signal))+((lower order bit (A2) of the identification signal))/6)).

Third Exemplary Embodiment

Method of Storing Some Measurement Data in Memory

Figure 16:
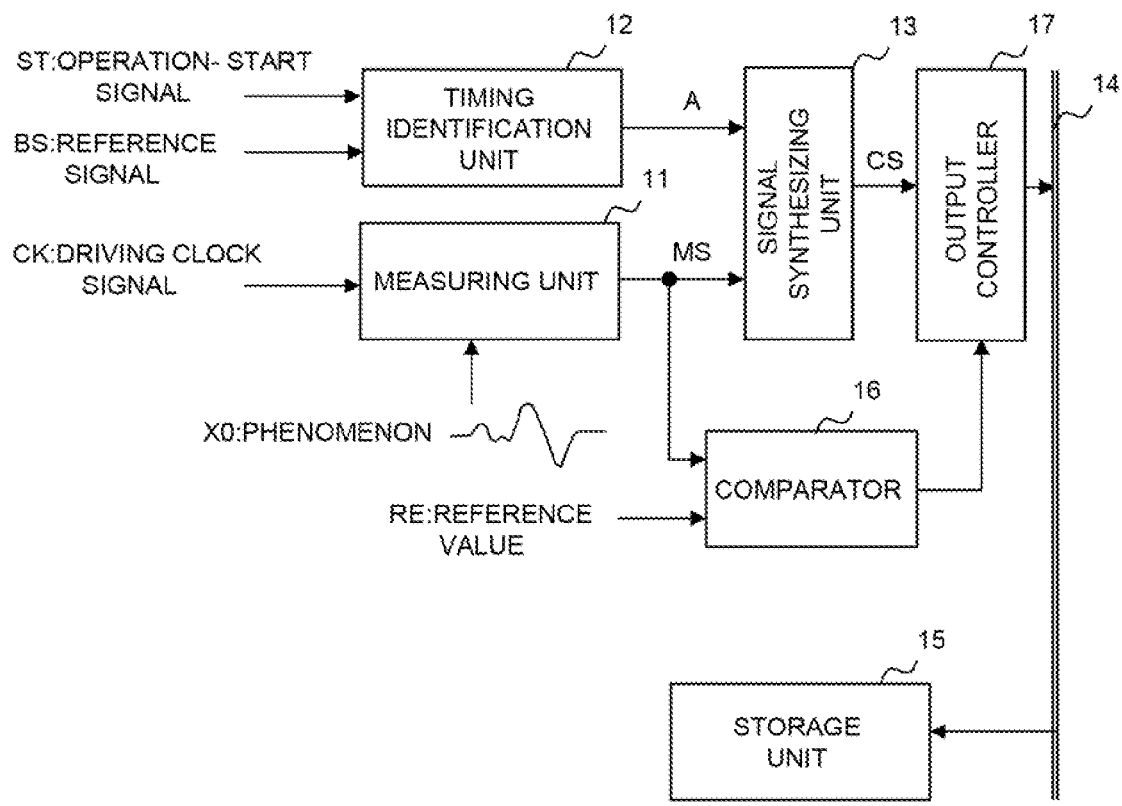
FIG. 16 is a block diagram illustrating the configuration of a signal measuring device according to a third exemplary embodiment of the present invention.

FIG. 16 is a block diagram illustrating the configuration of a signal measuring device according to a third exemplary embodiment of the present invention. Components in FIG. 16 identical with those shown in FIG. 1 are designated by like reference characters and are not described again. A comparator 16 senses whether the measurement-result signal MS is outside the range of a reference value RE set in advance. If the measurement-result signal MS is outside the range of the reference value RE, i.e., if it is recognized that phenomenon X0 is abnormal, this fact is reported to an output controller 17. The output controller 17 transfers the synthesized signal CS, which is output by the signal synthesizing unit 13, to the storage unit 15 only in a case where phenomenon X0 is abnormal. If this arrangement is adopted, the overall number of items of data stored in the storage unit 15 can be reduced and a reduction in the amount of memory in storage unit 15 is achieved.

In the case of this arrangement, the number of those items of data stored in memory for which the identification signals A are identical changes in accordance with the result of the selection by the output controller 17. As a consequence, the time of the measurement-result signal cannot be estimated in accordance with the number of identification signals stored in the memory signal as illustrated in FIG. 5. Accordingly, an identification signal generating method capable of identifying data generation timing by incorporating the order of data generation and the number of items of data for which identification signals are identical in the identification signal will be described below.

Figure 17:
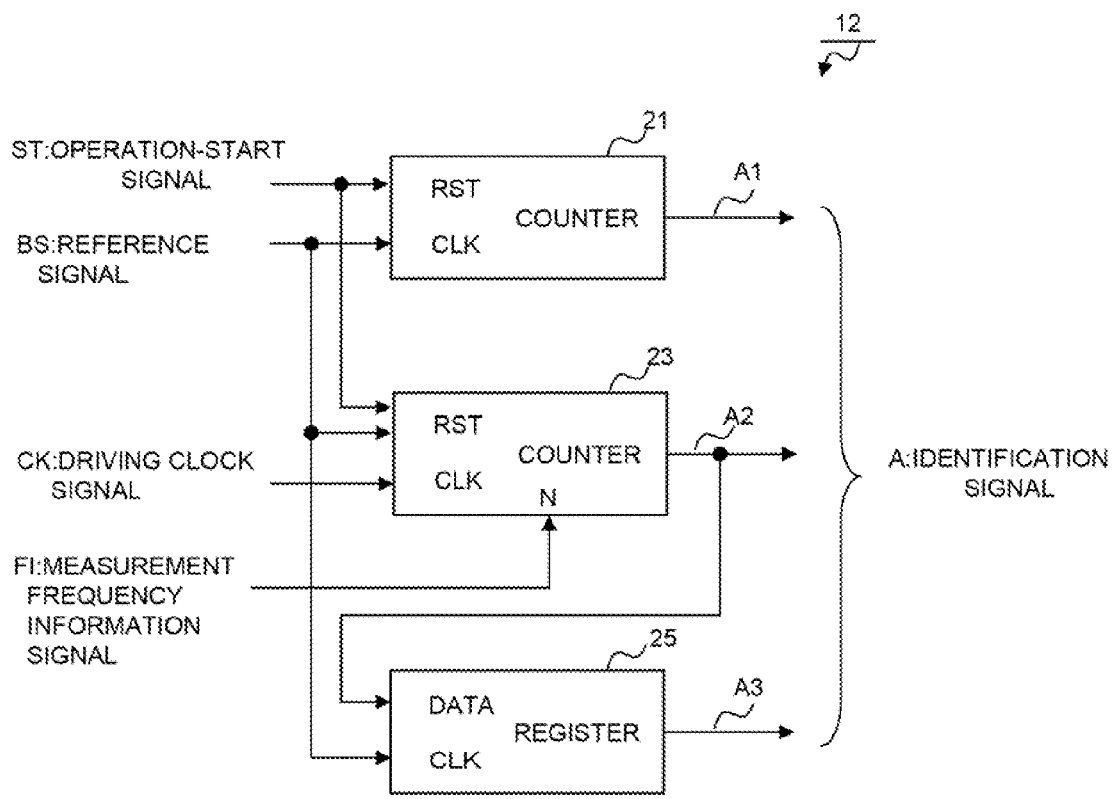
FIG. 17 is a block diagram illustrating the configuration of a timing identification unit according to a third exemplary embodiment of the present invention.

The configuration of the timing identification unit 12 according to the third exemplary embodiment is illustrated in FIG. 17. Components in FIG. 17 identical with those shown in FIG. 15 are designated by like reference characters and are not described again. The timing identification unit 12 includes the reset-equipped counter 21 for generating the higher order bit (A1) of the identification signal; the reset-equipped counter 23 for generating the lower order bit (A2) of the identification signal; and a register 25 for generating a period bit indicating the number of items of data for which identification signals are identical. The register 25 holds the value of the lower order bit (A2) (the value prevailing immediately before B is reset) of the identification signal whenever the reference signal BS rises and outputs the held value as a period bit (A3).

Figure 18:
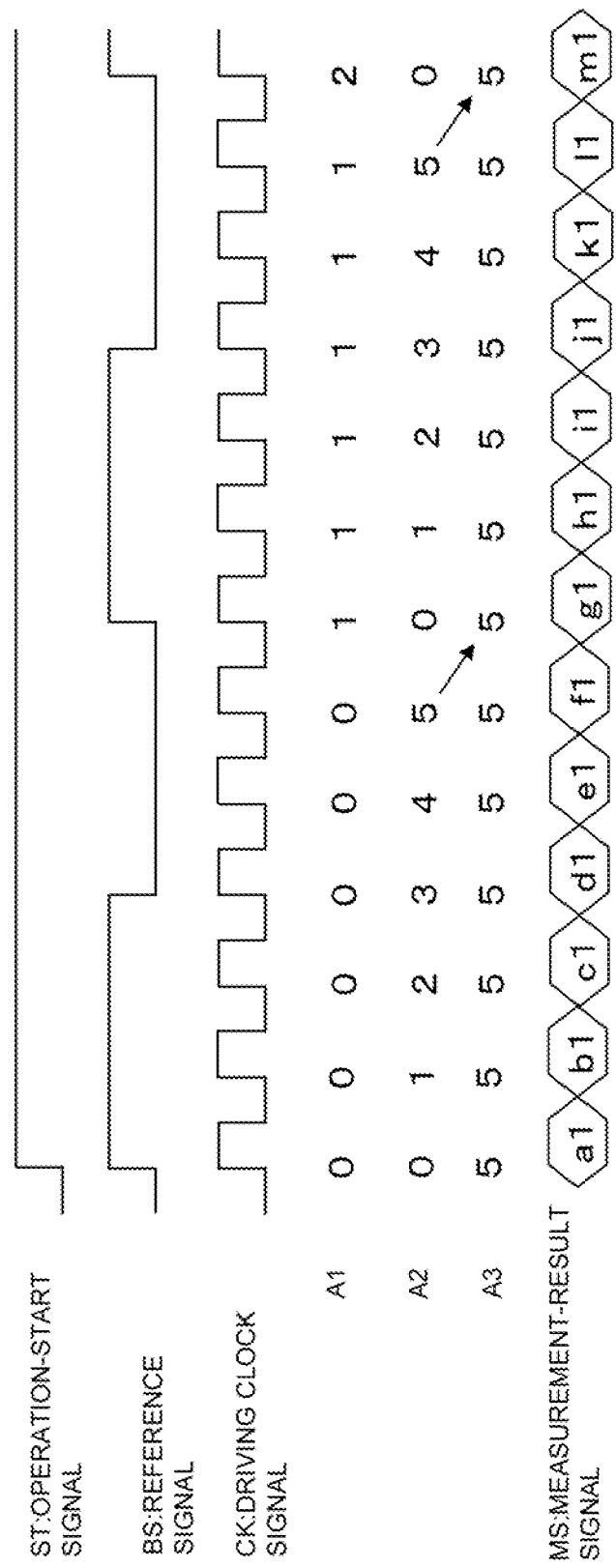
FIG. 18 is a diagram illustrating the operation timings of a signal measuring device according to a third exemplary embodiment of the present invention.

The operation of the timing identification unit 12 shown in FIG. 17 is illustrated in the timing chart of FIG. 18. First, when the operation-start signal ST is input, the identification signal A is reset to 0. At every rising edge of the driving clock signal CK thereafter, the values a1, h1, . . . , of the measurement-result signal MS are output and the lower order bit (A2) of the identification signal is incremented by one. When the reference signal BS rises again thereafter, the lower order bit (A2) is reset to 0, the register 25 operates and the immediately preceding value "5" of the lower order bit (A2) is output as the period bit (A3). This value is equal to a value that is one less than the number of times the driving clock signal CK rose within period of the reference signal BS.

Accordingly, in the measurement data that has been stored in the storage unit 15, as shown in FIG. 19, when the data is read out of the storage unit 15 in which the measurement operation has been stored and the generation timing of each measurement-result signal is identified, it can be estimated that measurement was performed (period bit (A3)+1) times at equal time intervals (Ts/(A3+1)) within the period (let this be Ts) of the reference signal even without counting the number of items of data for which the identification signals in the memory are identical. Here the operation timing of each item of data is estimated to be Ts*(A1+A2(A3+1)). For example, in FIG. 19, since the identification signal accompanying the value h1 of the measurement-result signal MS is such that the value of A3 is 5 when A1 is 1 and A2 is 1, the timing at which h1 was generated is estimated to be Ts*(1+1/6). This result agrees with FIG. 18.

Fourth Exemplary Embodiment

Figure 20:
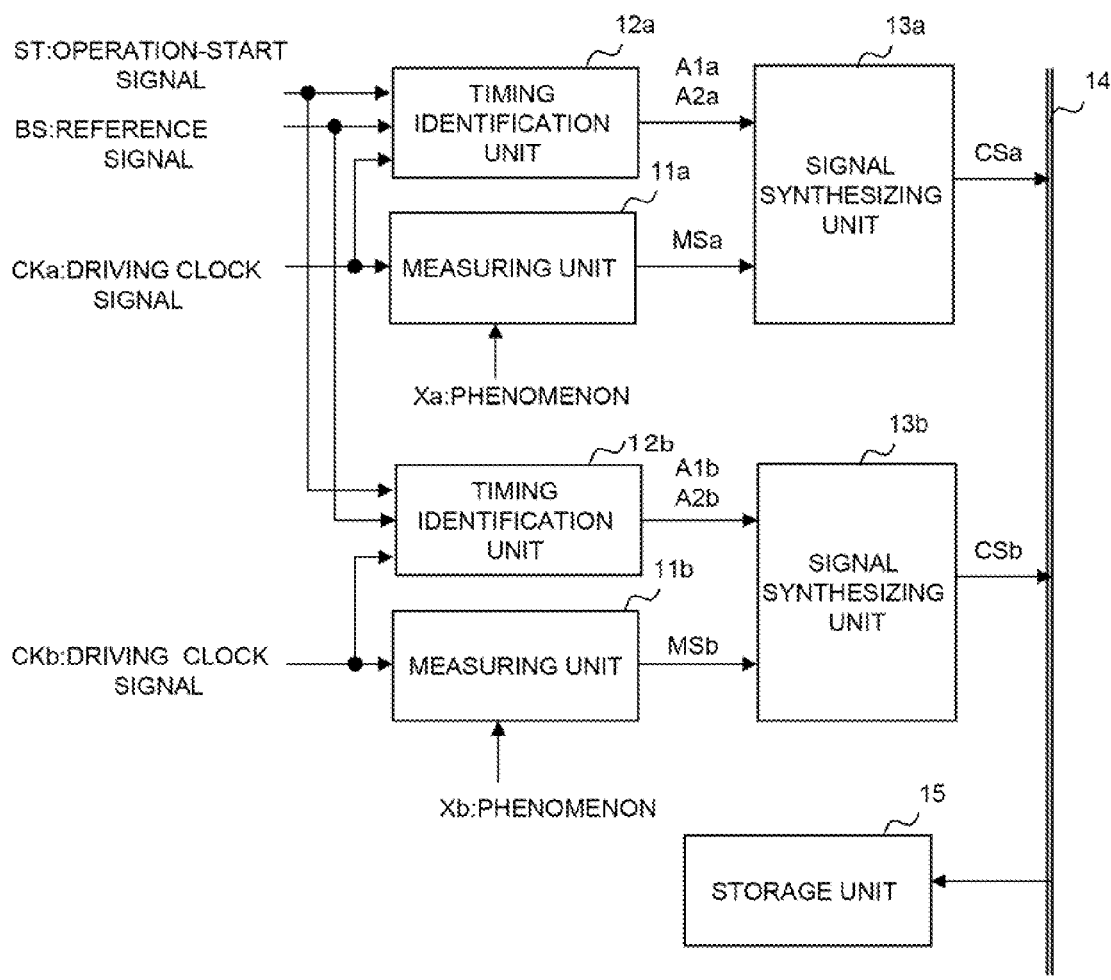
FIG. 20 is a block diagram illustrating the configuration of a signal measuring device according to a fourth exemplary embodiment of the present invention.

Method of Synchronizing Plurality of Measurement Macros or Different Types of Data Such as Macro I/O Data FIG. 20 is a block diagram illustrating the configuration of a signal measuring device according to a fourth exemplary embodiment of the present invention. Measuring units 11a, 11b in FIG. 20 are identical with the measuring unit 11 of FIG. 1, timing identification units 12a, 12b are identical with the timing identification unit 12 of FIG. 1, and signal synthesizing units 13a, 13b are identical with the signal synthesizing unit 13 of FIG. 1.

The signal measuring device of the fourth exemplary embodiment specifies the time relationship among a plurality of items of measurement data such as measurement results from a plurality of measuring units or input/output data of a macro. In order to synchronize the measuring unit 11a and the measuring unit 11b, the reference signal BS and operation-start signal ST that are input to the timing identification unit 12a and timing identification unit 12b are distributed in such a manner that the edges thereof will rise at the same timing. By setting the period Ts of the reference signal BS to a whole-number multiple of the lowest common multiple of the periods of the clock signals (here CKa and Ckb) of all measuring units, the measurement times of measurement-result signals MSa, MSb stored in the storage unit 15 can be estimated correctly.

Figure 21:
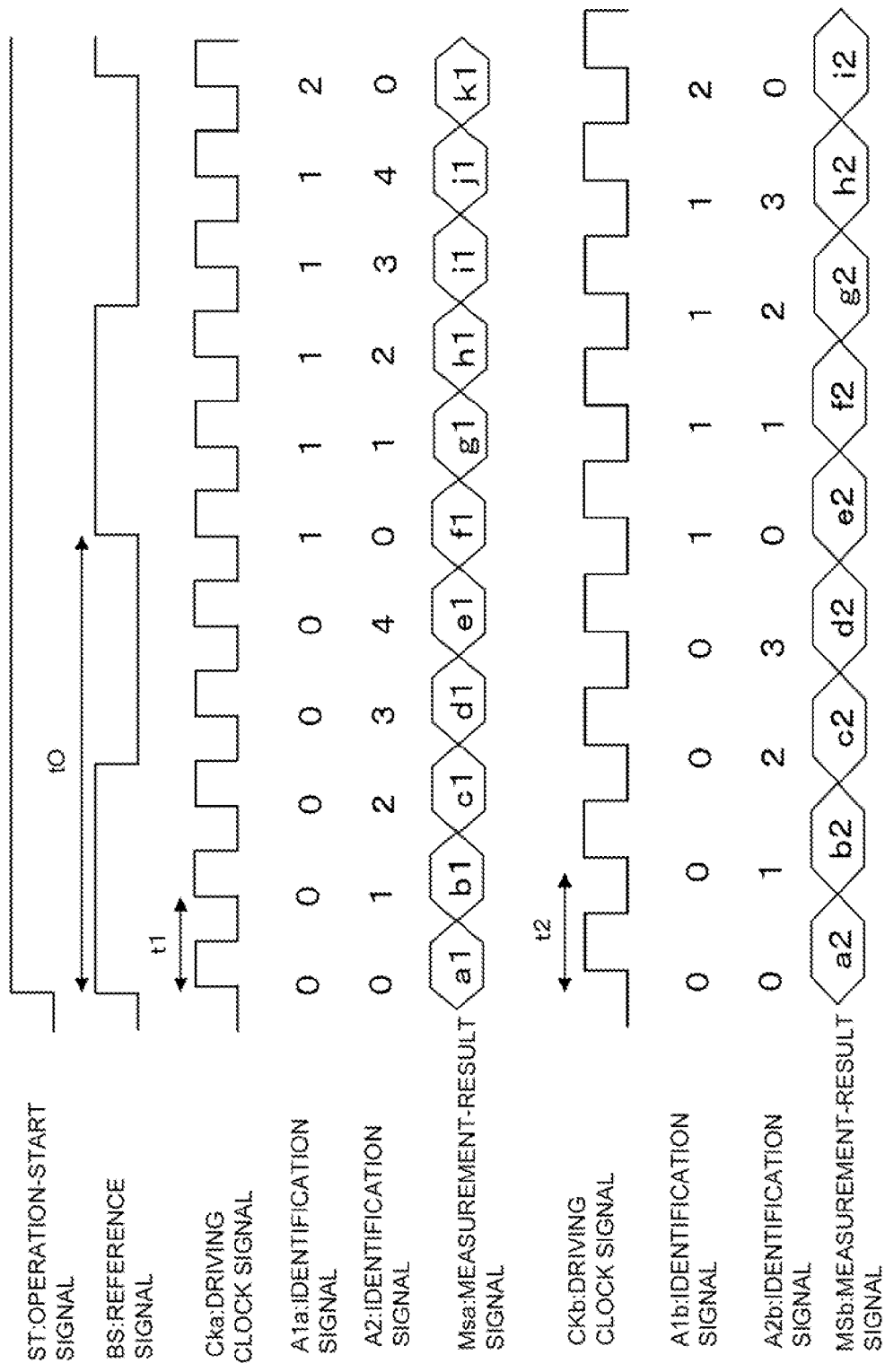
FIG. 21 is a diagram illustrating the operation timings of a signal measuring device according to a fourth exemplary embodiment of the present invention.

An example of operation timings of the signal measuring device thus constructed is illustrated in FIG. 21. If we let t1 (e.g., 4 ns) represent the period of the driving clock of measuring unit 11a and let t2 (e.g., 5 ns) represent the period of the driving clock of measuring unit 11b, then the period of the reference signal BS is set to t0 (e.g., 20 ns), which is the lowest common multiple of t1 and t2. As a result of this setting, the number of measurement-result signals MSa for which the identification signals of measuring unit 11a are identical will always be five, by way of example. On the other hand, the number of measurement-result signals MSb for which the identification signals of measuring unit 11b are identical will always be four, by way of example.

Figure 22:
FIG. 22 is a first diagram illustrating the structure of data that has been stored in a storage unit according to a fourth exemplary embodiment of the present invention.
Figure 23:
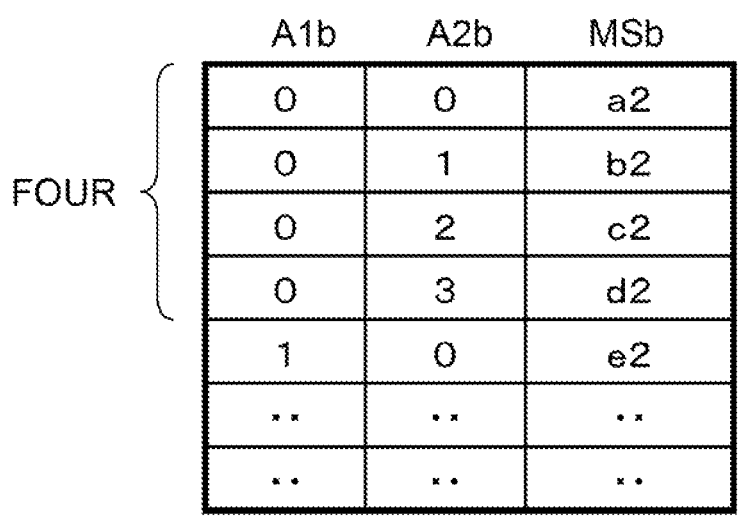

The results of storing synthesized signal CSa and synthesized signal CSb is the storage unit 15 are shown in FIGS. 22 and 23, respectively. When the data is extracted from the storage unit 15 and the generation timings of the measurement-result signals MSa, MSb are identified, the numbers of items of data for which the identification signals within the storage unit 15 are identical are five and four, respectively.

Accordingly, the measurement interval of the measuring unit 11a is estimated to be t0 (20 ns)/5=t1 (4 ns), and the measurement interval of the measuring unit 11b is estimated to be t0 (20 ns)/4=t2 (5 ns). It will be understood that this agrees with the measurement intervals shown in FIG. 21 and that the measurement intervals of the measurement results can be restored correctly.

Figure 24:
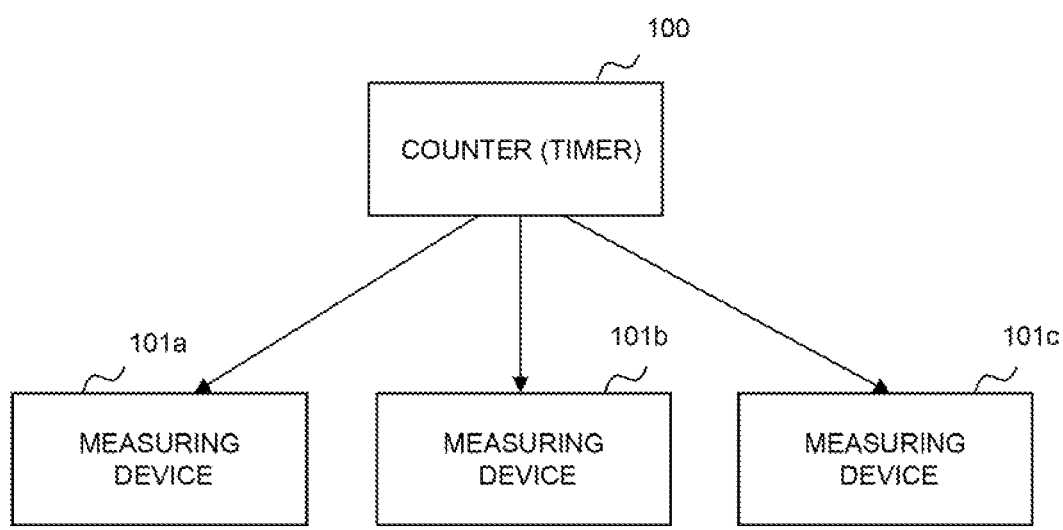
FIG. 24 is a block diagram illustrating the configuration of a signal measuring device of time centralized-management-type according to the prior art.
Figure 25:
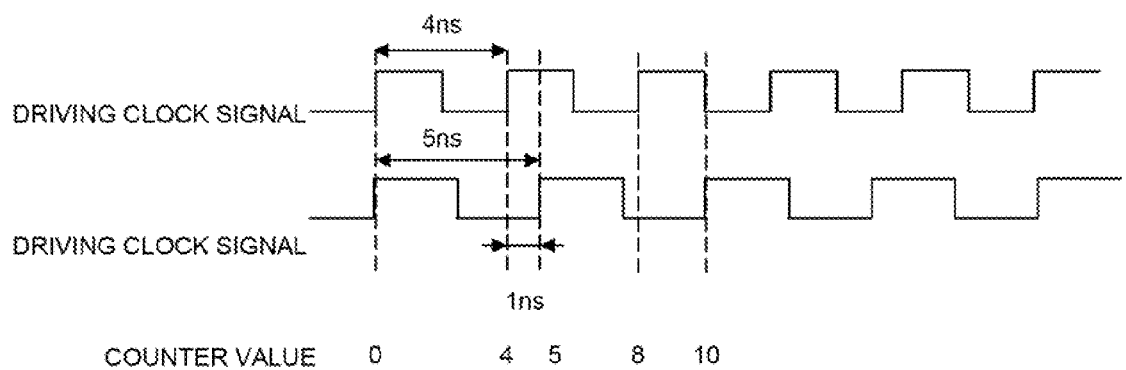
FIG. 25 is a diagram illustrating the operation timings of a signal measuring device of time centralized-management-type according to the prior art.

FIG. 24 is a block diagram illustrating the configuration of a signal measuring device of time centralized-management-type according to the prior art. A counter 100 in FIG. 24 gathers measurement-result signals from measuring devices 101a, 101b, 101c and identifies timing. If the signal measuring device according to this exemplary embodiment and the device of time centralized-management-type (FIG. 24) are compared, the conventional device of time centralized-management-type necessitates a high-speed counter that operates at a period that is the greatest common divisor of the operating period of the measuring device. For example, if the generation timings of the measurement-result signals of a first measuring unit that performs measurement at a period of 4 ns and of a second measuring unit that performs measurement at a period of 5 ns are identified, a counter (timer) capable of distinguishing 1 ns will be required, i.e., it will be necessary to update the value of the counter at 1 GHz. In the case of this exemplary embodiment, on the other hand, timing can be restored accurately by distributing only a low-speed reference signal, namely a reference signal the period of which is 20 ns, which is the lowest common multiple of the measurement period of each measuring unit, to all of the timing identification units. This is advantageous in that a high-speed clock signal is unnecessary.

Fifth Exemplary Embodiment

Application to Logic Circuits

Figure 26:
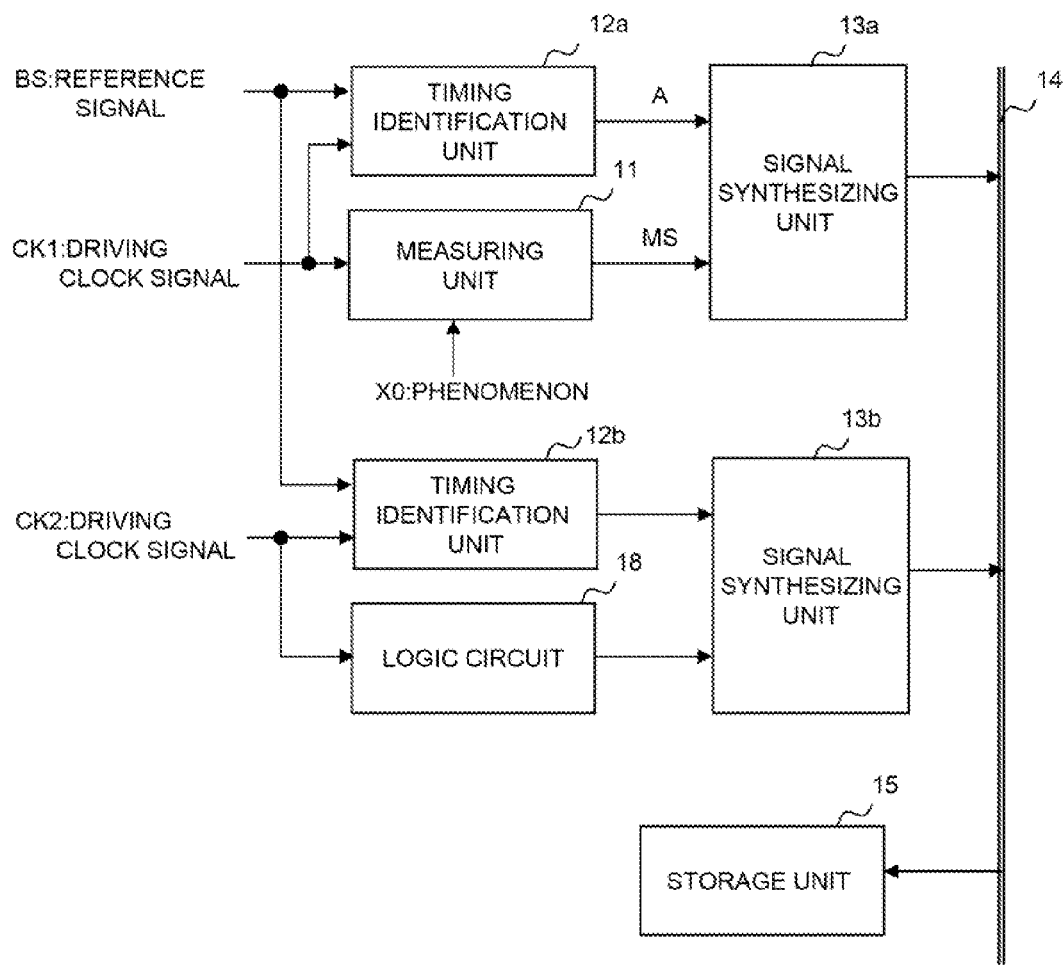
FIG. 26 is a block diagram illustrating the configuration of a signal measuring device according to a fifth exemplary embodiment of the present invention.

FIG. 26 is a block diagram illustrating the configuration of a signal measuring device according to a fifth exemplary embodiment of the present invention. Components in FIG. 26 identical with those shown in FIG. 1 are designated by like reference characters. Timing identification units 12a, 12b are identical with the timing identification unit 12 of FIG. 1, and signal synthesizing units 13a, 13b are identical with the signal synthesizing unit 13 of FIG. 1. A logic circuit 18 is one that operates at a driving clock signal CK2 and outputs the measurement-result signal MS. The timing identification unit 12b is synchronized to one edge, e.g., the rising edge, of the driving clock signal CK2 and outputs the identification signal A at every rising edge of the driving clock signal CK2.

The timing identification unit 12b is synchronized to one edge, e.g., the rising edge, of the driving clock signal CK2 and outputs the identification signal at every rising edge of the driving clock signal CK2. This makes it possible to restore operation timing after data is stored in storage unit 15. The timing identification unit 12b may have the same structure as that of the timing identification unit 12a. Alternatively, it is permissible to use a signal that takes on a different value at every rising edge of the logic operating clock, e.g., a program counter, etc.

Sixth Exemplary Embodiment

Application to Specification of Cause—Effect Relationship

Figure 27:
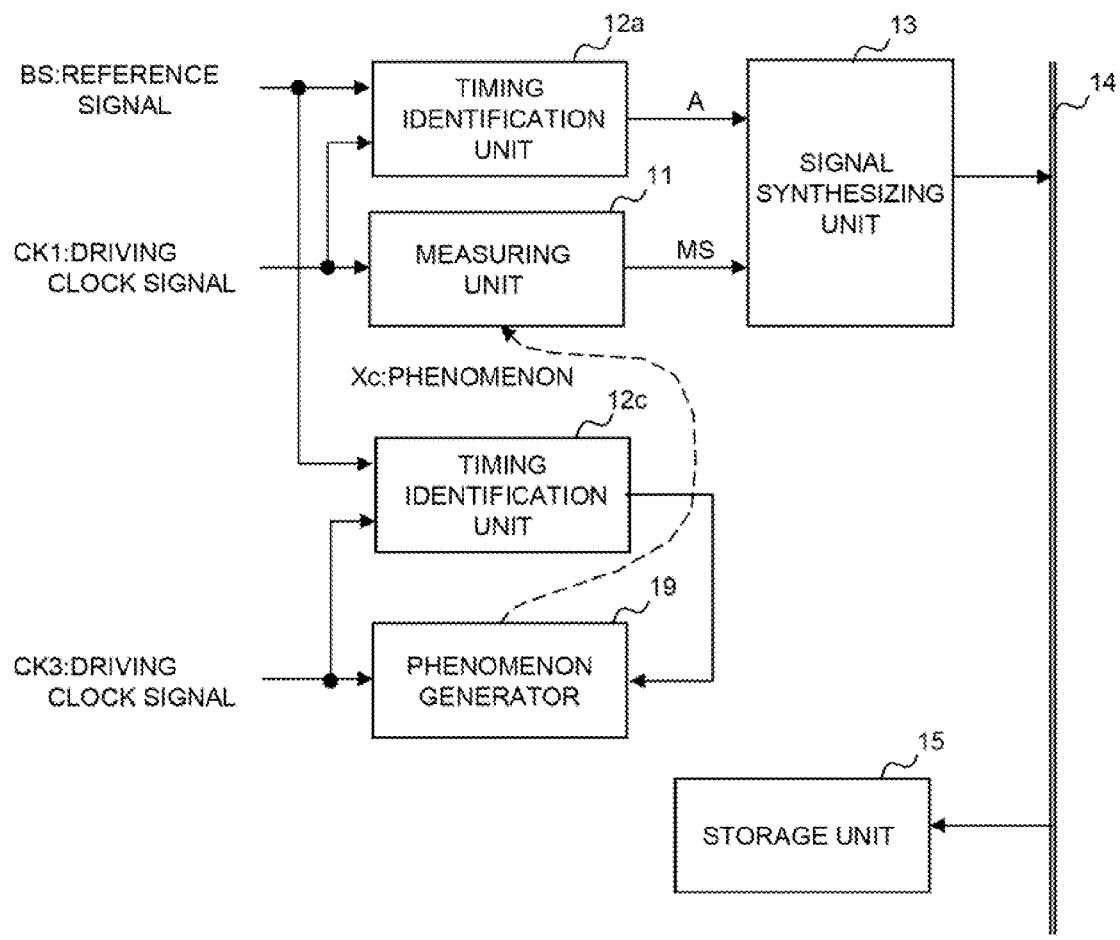
FIG. 27 is a block diagram illustrating the configuration of a signal measuring device according to a sixth exemplary embodiment of the present invention.

FIG. 27 is a block diagram illustrating the configuration of a signal measuring device according to a sixth exemplary embodiment of the present invention. Components in FIG. 27 identical with those shown in FIG. 1 are designated by like reference characters. Timing identification units 12a, 12c are identical with the timing identification unit 12 of FIG. 1. Furthermore, in this exemplary embodiment, a certain phenomenon is generated by a phenomenon generator 19, another phenomenon Xc that occurs owing to the generated phenomenon is measured by the measuring unit 11 and the cause—effect relationship between the two phenomena is specified. For example, by determining the status of the phenomenon generator 19 by the identification signal A, it is possible to specify the time relationship between the phenomenon generated by the phenomenon generator 19 and the phenomenon Xc produced by this phenomenon and measured by measuring unit 11.

Seventh Exemplary Embodiment

Figure 28:
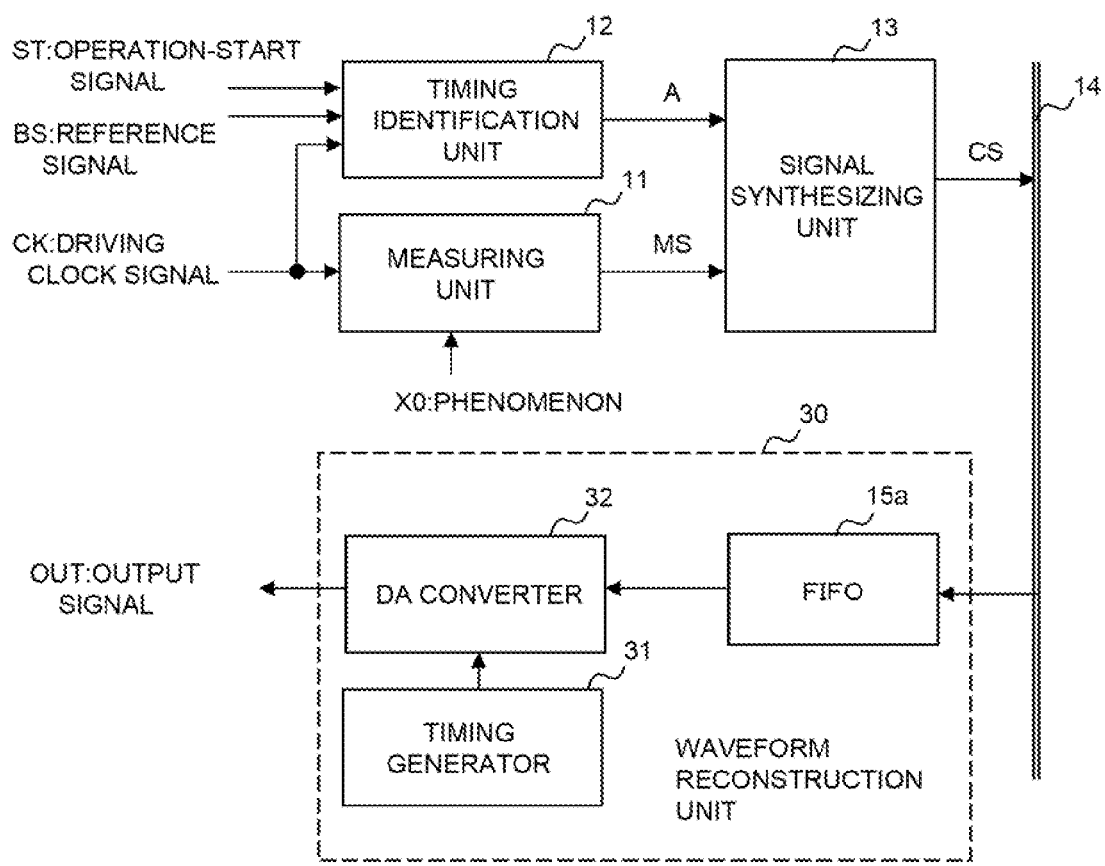
FIG. 28 is a block diagram illustrating the configuration of a signal measuring device according to a seventh exemplary embodiment of the present invention.

Method of Restoring Time Relationship of Measurement Data Values and Reconstructing Real Time Waveform FIG. 28 is a block diagram showing the configuration of a signal measuring device according to a seventh exemplary embodiment of the present invention. Components in FIG. 28 identical with those shown in FIG. 1 are designated by like reference characters. This signal measuring device has a waveform reconstruction unit 30. The waveform reconstruction unit 30 includes a FIFO 15a for storing the entered measurement-result signal temporarily; a timing generator 31 for converting a value of the identification signal to output timing; and a DA converter 32 for converting digital data to an analog value. The synthesized signals CS are stored successively in the FIFO 15a within the waveform reconstruction unit 30. From among the synthesized signals that have been stored in the FIFO 15a, the timing generator 31 extracts the oldest synthesized signal, the extracted signal is converted to an analog signal by the DA converter 32 and the analog signal obtained by the conversion is output as an output signal OUT. The synchronizing signal (clock) that actuates the DA converter 32 is generated by the timing generator 31.

In a case where the measurement-result signal MS from the measuring unit 11 is extracted to the exterior of the chip via a bus or chip interface circuit that operates at a frequency different from that of the measuring unit 11, the operation timing of the measurement-result signal and the timing at which the measurement-result signal is output to the chip exterior will no longer coincide. Furthermore, the digital data thus measured cannot be observed directly by a measuring device, such as an oscilloscope, for measuring an analog waveform. A solution is to reconstruct the measurement-result signal MS, to which the identification signal A has been appended, by the waveform reconstruction unit 30 and output an analog waveform, as illustrated in FIG. 28.

The measurement-result signal MS with the appended identification signal A is generated by a method similar to that shown in FIG. 1. If the synchronizing signal (clock) that actuates the DA converter 32 is generated by the timing generator 31 and the clock period of the synchronizing signal is set to Ts, then a waveform can be reproduced at a time identical to the phenomenon X0. An advantage of this method is that even when the interval at which the synthesized signal is input to the waveform reconstruction unit 30 is not precisely every Ts, if control is exercised in such a manner that a state is attained in which one or more signals have accumulated in data, which has not been converted to an analog voltage, in the FIFO 15a within the waveform reconstruction unit 30, then the interval at which the reconstructed analog voltage is output will always be fixed (Ts).

Figure 29:
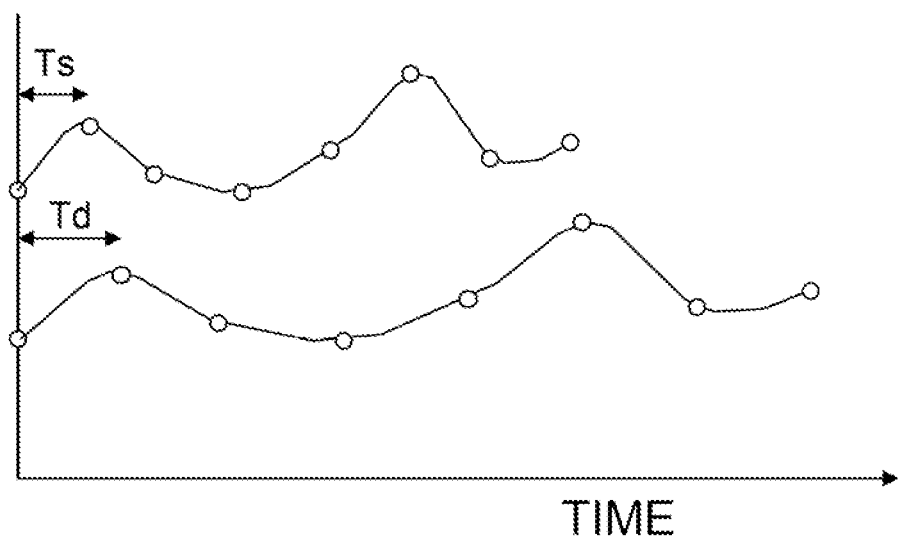
FIG. 29 is a diagram illustrating an analog waveform that is output in a signal measuring device according to a seventh exemplary embodiment of the present invention.

Further, by making the period at which the DA converter 32 is actuated a period Td longer than Ts, as illustrated in FIG. 29, the phenomenon measured every period Ts is elongated to the period Td and is output at the output of the waveform reconstruction unit 30. An advantage of this is that a phenomenon that fluctuates at high speed within the chip can be observed even if use is made of a measuring device having a low band (the maximum measurable value of signal frequency). Further, since the operating speed of the DA converter 32 can be lowered to Td, waveform restoration is possible even with a DA converter having a low operating band.

Furthermore, in a case where the period of the driving clock signal CK is changed, an analog voltage restored to a correct period based upon the identification signal A can be output by appending the identification signal. A shown in FIG. 6. When a measurement signal to which a different identification signal A has been appended has entered, the measurement time of measurement data having the immediately preceding value of the identification signal is finalized. For example, when a measurement signal having an identification signal 2 is input in a case where a measurement signal of an identification signal 1 has been stored in memory, the generation time of the measurement signal of identification signal 1 is presumed to be $Ts*((\text{value of identification signal})+(m/N))$ (m=0, 1, 2, ... N−1), where N represents the number of measurement signals of identification signal 1. Accordingly, a clock signal that operates at a period $Ts*((\text{value of identification signal})/N)$ is generated by the timing generator 31 and the measurement data having the identification signal 1 is restored to an analog signal using the generated clock signal. Next, when a measurement signal having an identification signal 3 is input, the generation time of the measurement signal of identification signal 2 is presumed to be $Ts*((\text{value of identification signal})+(m/M))$ (m=0, 1, 2, ... M−1), where M represents the number of measurement signals of identification signal 2. Accordingly, a clock signal that operates at a period $Ts*((\text{value of identification signal})/M)$ is generated by the timing generator 31 and the measurement data having the identification signal 2 is restored to an analog signal using the generated clock signal. By repeating this operation, an analog waveform having a waveform period identical with the timing at which a phenomenon has been observed can be reproduced even in a case where the period fluctuates.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention.

What is claimed is:
1. A signal measuring device, comprising:
one set, or a plurality of sets, of measuring unit(s) measuring an object of measurement in synch with a driving clock signal for measurement and outputting a result of the measurement as first data, and a timing identification unit which, in accordance with a measurement-start command, outputs a value, which differs every period, as second data in synch with a reference signal having a prescribed period and a speed lower than that of the driving clock signal; and a storage unit collecting and successively storing the first data and the second data as one set in synch with the driving clock signal, wherein the reference signal is a different signal than the driving clock signal, the reference signal not being used for measuring the object of measurement, wherein the signal measuring device further comprises:

a digital-to-analog converter reading out the first data successively in order of decreasing age in terms of storage in said storage unit, and converting the first data to an analog value; and a timing generator operating said digital-to-analog converter at a longer period than a period of the reference signal.

2. A signal measuring device according to claim 1, wherein said timing identification unit has a reset-equipped counter, that is reset in accordance with the measurement-start command, for outputting the second data upon its value being incremented or decremented by one every period of the reference signal.

3. A signal measuring device according to claim 1, wherein said timing identification unit comprises:

a first reset-equipped counter, that is reset in accordance with the measurement-start command, for outputting one constituent element of the second data upon its value being incremented or decremented by one every period of the reference signal; and a second reset-equipped counter, which is reset when the measurement-start command is input or when one edge of the reference signal is input, for outputting another constituent element of the second data upon its value being incremented or decremented by one every period of the reference signal.

4. A signal measuring device according to claim 3, wherein said second reset-equipped counter receives as an input a measurement frequency information signal indicating what multiple the period of the driving clock signal is in comparison with the period when it is shortest, and changes over the counting increment based upon the measurement frequency information signal instead of being incremented or decremented by one.

5. A signal measuring device according to claim 3, wherein said timing identification unit comprises a register that holds an output of said second reset-equipped counter that prevails immediately before one edge of the reference clock signal is input;

the second data including the output data of said register as a further constituent element.

6. A signal measuring device according to claim 3, further comprising:

a comparator and an output controller provided with respect to at least one set of the one or plurality of sets of said measuring unit and said timing identification unit; wherein said comparator determines whether the first data falls within a prescribed range; and said output controller exercises control in such a manner that if the first data does not fall within the prescribed range, then the first data that does not fall within the prescribed range and the second data corresponding to the first data that does not fall within the prescribed range are stored in the storage unit successively as one set.

7. A signal measuring device according to claim 1, wherein the reference signal has a period that is a whole-number multiple of the driving clock signal.

8. A signal measuring device according to claim 1, wherein reference signals in respective ones of the plurality of sets may be a common reference signal.

9. A signal measuring device according to claim 8, wherein the reference signal adopted as the common reference signal has a period that is a whole-number multiple of the lowest common multiple of the periods of the driving clock signals in respective ones of the plurality of sets.

10. A signal measuring device according to claim 1, wherein a period of said digital-to-analog converter varies in conformity with the second data read out of the storage unit together with the first data.

11. A signal measuring method, comprising:

measuring, by a signal measuring device, an object of measurement in synch with a driving clock signal for measurement and outputting a result of the measurement as first data;

in accordance with a measurement-start command, outputting, by the signal measuring device, a value, which differs every period, as second data in synch with a reference signal having a prescribed period at a speed lower than that of the driving clock signal; and collecting and successively storing, by the signal measuring device, the first data and the second data as one set of data in synch with the driving clock signal, wherein the reference signal is a different signal than the driving clock signal, the reference signal not being used for measuring the object of measurement, wherein the signal measuring method further comprises:

reading out, by a digital-to-analog converter, the first data successively in order of decreasing age in terms of storage;

converting, by said digital-to-analog converter, the read-out first data to an analog value and outputting the analog value;

operating, by a timing generator, said digital-to-analog converter at a longer period than a period of the reference signal.

12. A signal measuring method according to claim 11, wherein at said outputting the value as the second data, reset is performed in accordance with the measurement-start command and the second data is out upon its value being incremented or decremented by one every period of the reference signal.

13. A signal measuring method according to claim 11, wherein said outputting the value as the second data includes:

a first step, which is reset in accordance with the measurement-start command, wherein one constituent element of the second data is output upon its value being incremented or decremented by one every period of the reference signal; and a second step, which is reset when the measurement-start command is input or when one edge of the reference signal is input, wherein another constituent element of the second data is output upon its value being incremented or decremented by one every period of the reference signal.

14. A signal measuring method according to claim 13, wherein at said second step, a measurement frequency information signal indicating what multiple the period of the driving clock signal is in comparison with the period when it is shortest is received as an input, and the counting increment is changed over based upon the measurement frequency information signal instead of being incremented or decremented by one.

15. A signal measuring method according to claim 13, wherein said second step includes:
holding another constituent element of the second data that prevails immediately before one edge of the reference clock signal is input;
the second data including this held other constituent element as a further constituent element.

16. A signal measuring method according to claim 11, wherein the reference signal has a period that is a whole-number multiple of the driving clock signal.

17. A signal measuring method according to claim 11, wherein said successively storing the first data and the second data includes:
determining whether the first data falls within a prescribed range; and
if the first data does not fall within the prescribed range, storing successively, as one set, the first data that does not fall within the prescribed range and the second data corresponding to the first data that does not fall within the prescribed range.

18. A signal measuring method according to claim 11, wherein at said converting the first data to the analog value and outputting the analog value, the period in which the conversion is made to the analog value varies in conformity with the second data read out together with the first data.

* * * * *